(12) United States Patent
Nguyen et al.

(10) Patent No.: US 10,819,365 B1
(45) Date of Patent: Oct. 27, 2020

(54) UTILIZING CURRENT MEMORY PROPERTY IN CURRENT STEERING DIGITAL-TO-ANALOG CONVERTERS

(71) Applicant: Analog Devices, Inc., Norwood, MA (US)

(72) Inventors: Khiem Quang Nguyen, Tewksbury, MA (US); Long Pham, Tewksbury, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/783,442

(22) Filed: Feb. 6, 2020

(51) Int. Cl.
*H03M 1/80* (2006.01)
*H03M 1/74* (2006.01)

(52) U.S. Cl.
CPC .................................. *H03M 1/742* (2013.01)

(58) Field of Classification Search
CPC .......... H03M 1/66; H03M 3/464; H03M 1/12; H03M 1/1009; H03M 1/1245; H03M 3/50; H03M 1/745; H03M 1/742; H03M 1/002; H03M 1/0872; H03M 3/502
USPC .................................. 341/135, 136, 144, 153
See application file for complete search history.

(56) References Cited

U.S. PATENT DOCUMENTS

| 5,274,375 | A | 12/1993 | Thompson |
| 5,654,710 | A | 8/1997 | Oh et al. |
| 7,042,374 | B1 * | 5/2006 | Manganaro ......... H03M 1/1057 341/120 |
| 7,079,063 | B1 | 7/2006 | Nguyen et al. |
| 7,307,568 | B1 | 12/2007 | Nhuyen |
| 7,777,658 | B2 | 8/2010 | Nguyen et al. |
| 7,812,753 | B1 | 10/2010 | Myles et al. |
| 7,924,197 | B1 | 4/2011 | Liu et al. |
| 7,994,957 | B2 | 8/2011 | O'Donnell et al. |
| 8,085,177 | B2 | 12/2011 | O'Donnell et al. |
| 8,164,502 | B2 | 4/2012 | Katsis et al. |
| 8,269,661 | B2 | 9/2012 | Corsi et al. |

(Continued)

FOREIGN PATENT DOCUMENTS

CN 102055478 A 5/2011

OTHER PUBLICATIONS

U.S. Appl. No. 14/868,616, filed Sep. 29, 2015.
(Continued)

*Primary Examiner* — Linh V Nguyen
(74) *Attorney, Agent, or Firm* — Patent Capital Group

(57) ABSTRACT

Improved switching techniques for controlling three-level current steering DAC cells are disclosed. The techniques include decoupling two current sources, implemented as field-effect transistors (FETs), of a DAC cell both from their respective bias sources and from a load for converting a zero digital input, where the decoupling is performed in a certain order. The techniques also include coupling the current sources to their respective bias sources and to the load for converting a non-zero digital input, where the coupling is also performed in a certain order. The certain order of decoupling and coupling the bias sources and the load to the current sources of a DAC cell are based on the phenomenon of current memory in FETs. Utilizing current memory when operating a DAC cell may allow reducing power consumption while preserving the high performance properties of a three-level current steering DAC.

20 Claims, 14 Drawing Sheets

(56) References Cited

U.S. PATENT DOCUMENTS

| | | | | |
|---|---|---|---|---|
| 8,653,999 | B1* | 2/2014 | Verlinden | H03M 1/662 |
| | | | | 341/144 |
| 9,397,676 | B1* | 7/2016 | Nguyen | H03M 1/002 |
| 10,693,489 | B2* | 6/2020 | Roh | H03M 3/502 |
| 2010/0141496 | A1* | 6/2010 | Takiguchi | H03M 1/0604 |
| | | | | 341/144 |
| 2011/0273317 | A1* | 11/2011 | Nagatani | H03M 1/662 |
| | | | | 341/144 |
| 2012/0306678 | A1 | 12/2012 | Hezer et al. | |
| 2014/0145867 | A1* | 5/2014 | Bandyopadhyay | H03K 17/063 |
| | | | | 341/144 |
| 2015/0220100 | A1* | 8/2015 | Zhu | H03M 1/1009 |
| | | | | 327/539 |

OTHER PUBLICATIONS

Non-Final Office Action (OA1) issued in U.S. Appl. No. 14/868,616 dated Feb. 24, 2016, 7 pages.
Notice of Allowance issued in U.S. Appl. No. 14/868,616 dated Apr. 14, 2016.
2nd Notice of Allowance issued in U.S. Appl. No. 14/868,616 dated May 26, 2016.
Mazlan et al., *Low Power Designs of Current Steered DAC's in CMOS Process: A Review*, International Journal on Electrical Engineering and Informatics—vol. 7, No. 2, Jun. 2015, 19 pages.

* cited by examiner

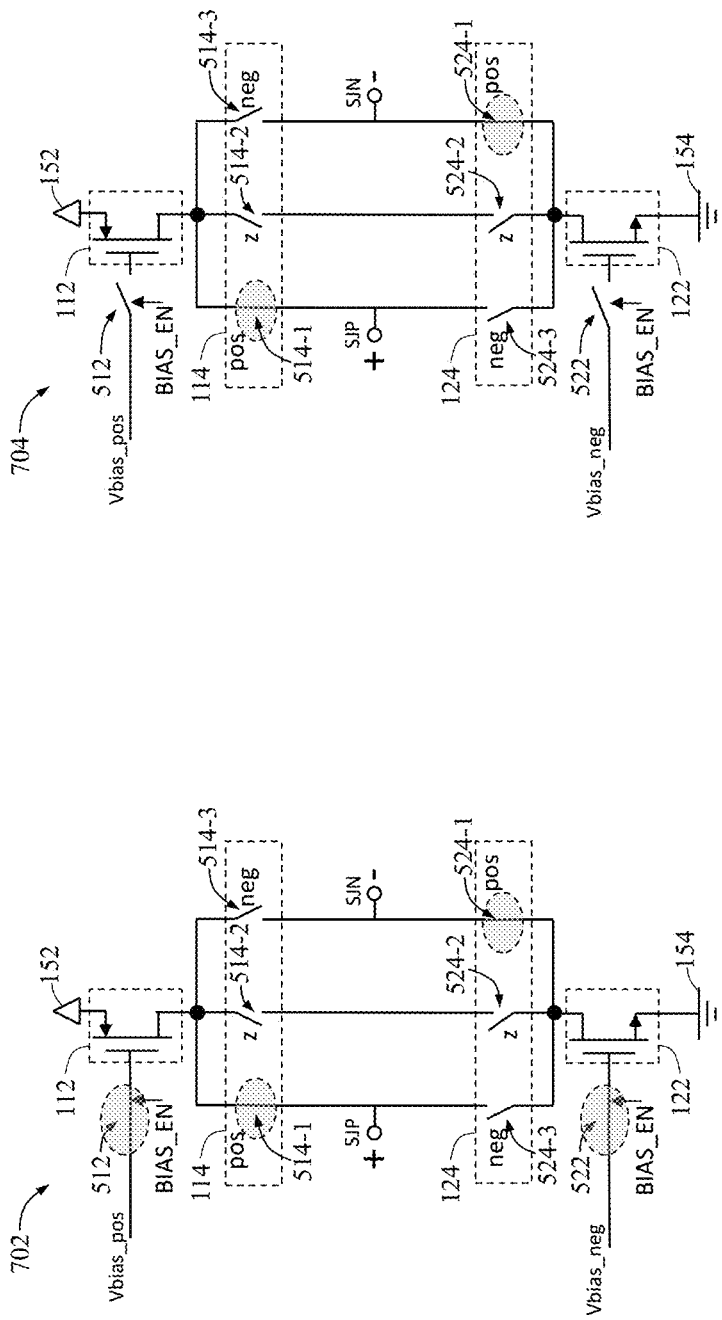

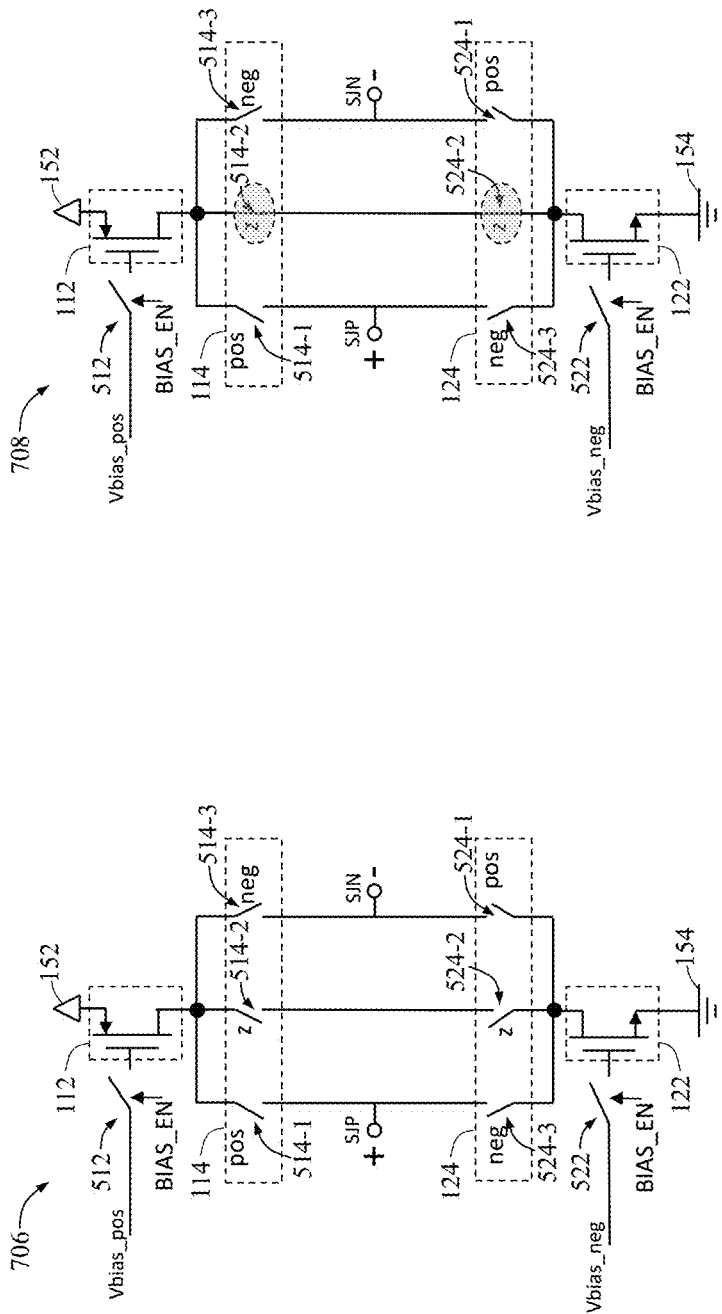

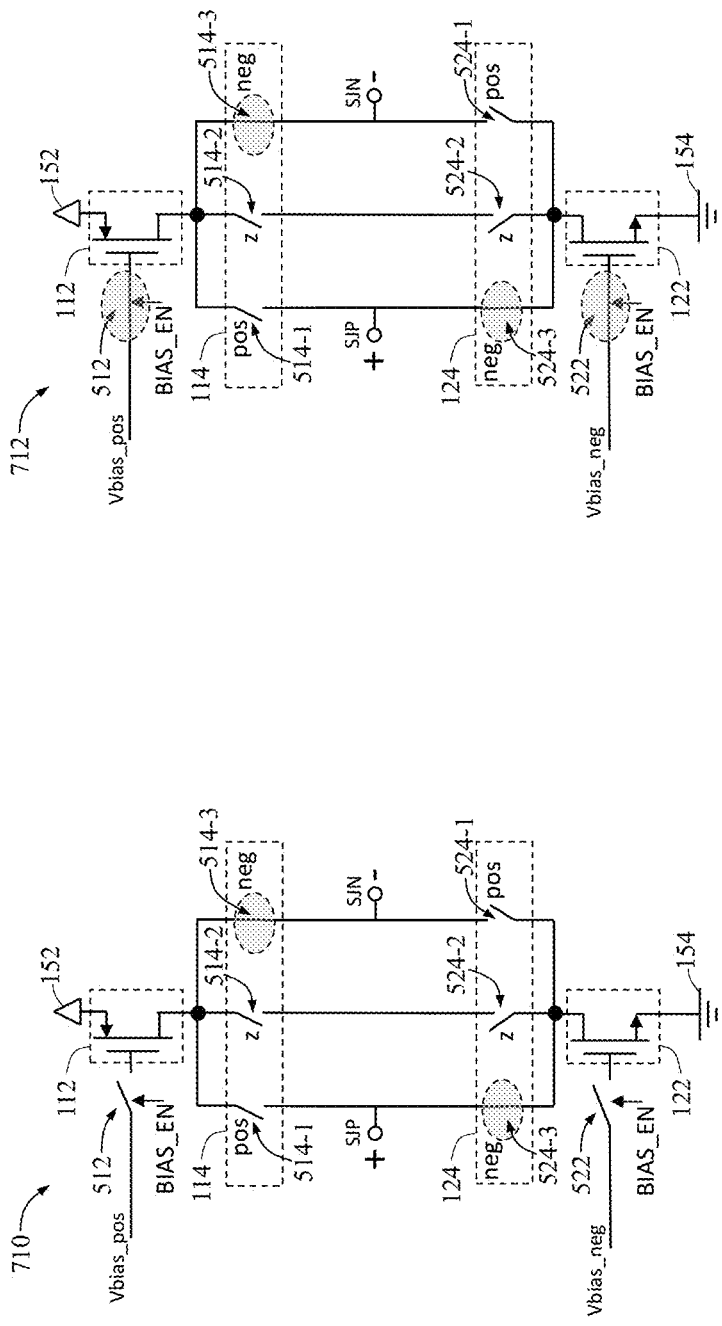

UTILIZING CURRENT MEMORY PROPERTY IN CURRENT STEERING DIGITAL-TO-ANALOG CONVERTERS

TECHNICAL FIELD OF THE DISCLOSURE

The present disclosure relates generally to digital-to-analog converters (DACs) and, more particularly, to switching techniques for operating current steering DACs.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

Power consumption is an issue that engineers continuously try to improve on. Improvements could be made with respect to reducing power consumption of DACs.

BRIEF DESCRIPTION OF THE DRAWINGS

To provide a more complete understanding of the present disclosure and features and advantages thereof, reference is made to the following description, taken in conjunction with the accompanying drawings, wherein like reference numerals represent like parts, in which:

FIGS. 7A-7F illustrate different states of the DAC cell of FIG. 5 when switching of FIG. 6 is performed, according to some embodiments of the disclosure;

DESCRIPTION OF EXAMPLE EMBODIMENTS OF THE DISCLOSURE

Overview

Figure 1:
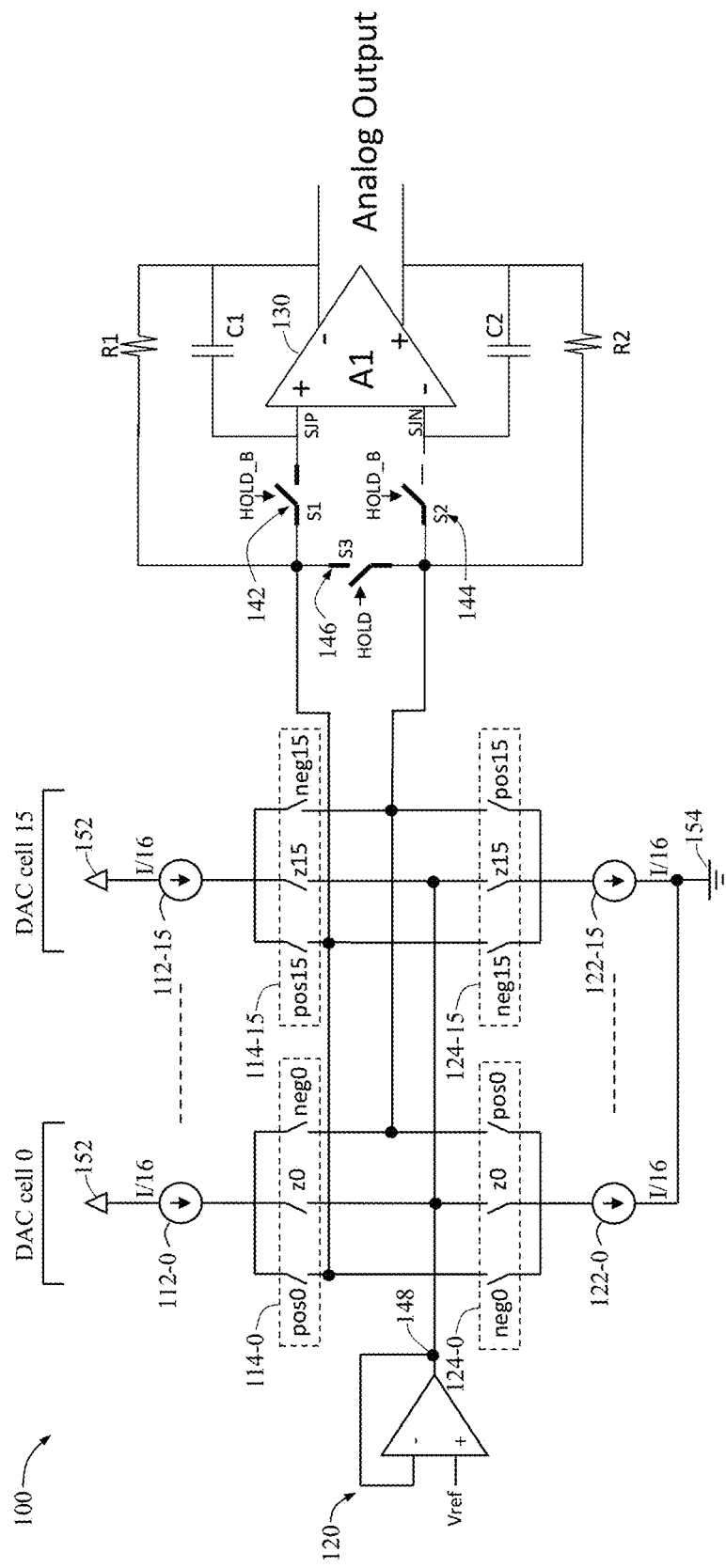
FIG. 1 illustrates an electric circuit diagram of a return-to-hold, a 16-bit, three-level, thermometer code current steering DAC according to prior art.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating methods and systems for reducing power consumption in three-level current steering DACs, proposed herein, it might be useful to first understand phenomena that may come into play in such devices. The following foundational information may be viewed as a basis from which the present disclosure may be properly explained. Such information is offered for purposes of explanation only and, accordingly, should not be construed in any way to limit the broad scope of the present disclosure and its potential applications.

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC cells to combine an appropriate number of these fractions to produce the output, a process sometimes referred to as "encoding." The number and size of the fractions reflect the number of possible digital input codes, which is a function of converter resolution or the number of bits (N) in the digital input code. For example, N bits could result in $2^N$ possible codes.

In a DAC, a digital signal may be provided to a coding element (encoder) which, in turn, may switch individual DAC cells of the DAC on and off to convert digital input values of the digital signal to analog values. Each DAC cell may produce an analog output/signal corresponding to a digital value being converted by the cell. The analog outputs from multiple DAC cells may be added together, e.g., by being provided to summing junctions of an amplifier, to represent a value of a multi-bit digital input value being converted. For example, a thermometer-coded DAC with 15 DAC cells may be capable of converting a 4-bit digital value (i.e., N=4) to one of 16 different analog values ($2^N$, so for N=4 the number of possible codes is $2^4$=16) by switching the appropriate DAC cells on. For example, to convert a digital value 0110 to an analog value—six DAC cells may be switched on, to convert a digital value 0111 to an analog value—seven DAC cells may be switched on, to convert a digital value 1001 to an analog value—nine DAC cells may be switched on, to convert a digital value 1011 to an analog value—eleven DAC cells may be switched on, and so on.

In context of a current-steering DAC, as used herein, the term "DAC cell," sometimes also referred to as a "DAC unit," refers to a device that includes two current sources, as well as switching mechanisms associated with each of the two current sources. The two current sources may be implemented as complementary field-effect transistors (FETs), e.g., as a p-type metal-oxide-semiconductor (PMOS) transistor and an n-type metal-oxide-semiconductor (NMOS) transistor. Current steering topology is a commonly used approach in industry to realize DACs. Due to its simplicity and flexibility, this topology is employed in a large combination of high-speed and/or high-resolution applications.

In the past, thermal noise performance has been recognized as a significant drawback of conventional thermometer-coded current steering DACs. One approach previously used to overcome the above-discussed thermal noise problem is based on employing so-called "three-level current steering DAC cells." The three levels refer to the fact that such a DAC cell responds to +1, 0, and −1 digital input (i.e., three levels of digital input). In particular, a three-level DAC cell is configured to output (to contribute to the summing junctions of the DAC): 1) a positive quantity of charge, in response to a digital input of +1, 2) a negative quantity of charge, in response to a digital input of −1, or 3) nothing at all, in response to a digital input of 0.

Inventors of the present disclosure realized that some existing three-level current steering DAC cells may be improved by reducing power consumption in the time periods where the DAC cells are supposed to not contribute any charge to the summing junctions (i.e., when the DAC cells are converting the digital input of 0). In particular, inventors of the present disclosure realized that power consumption of a three-level current steering DAC cell may be reduced by implementing switching techniques that utilize current memory property of FET-based current sources used in the cell. An example switching technique may begin with the two current sources of a DAC cell operating in a first state where respective bias signals are applied to the current sources and the current sources are coupled to a load (e.g., to a summing component, such as an amplifier, that combines outputs of different DAC cells of a DAC). The technique may then include setting the current sources to operate in a second state where the current sources are not coupled to either the bias signals or the load by, first, decoupling the bias signals from the current sources while keeping the current sources coupled to the load, and, second, decoupling the current sources from the load only after passing of a certain time period from the time when the bias signals were decoupled. Coupling the current sources of the DAC cell to their bias sources and the load to operate in the first state again may be performed in a reverse order. Namely, the switching technique may, first, couple the current sources to the load, and second, couple the bias signals to the current sources only after passing of a certain time period from the time when the current sources were coupled to the load. When the current sources are FETs, decoupling the bias signals from the current sources while keeping the current sources coupled to the load allows a current to still flow between the current sources and the load. Similarly, coupling the load to the current sources before the bias signals are connected will force a current through the DAC cell, resulting in the gate voltages of the FETs to be re-established, possibly to almost the original bias voltages, even before the bias signals are connected, an effect referred to herein as "current memory" of a FET-based current source or of a DAC cell. Disconnecting a DAC cell from the load and from the bias signals during the times when the DAC cell is not supposed to contribute any charge to the summing junctions may reduce power consumption of the cell. Performing disconnecting and connecting in the order that utilizes the current memory of the current sources of the cell advantageously allows disconnecting the DAC cell from the load and from the bias signals in a manner that does not jeopardize DAC's performance in terms of other parameters, such as total harmonic distortion (THD) and noise. The switching mechanisms described herein may be applicable to current steering DACs, and may be especially attractive for oversampling sigma-delta audio DAC applications.

The following detailed description presents various descriptions of specific certain embodiments. However, the innovations described herein can be embodied in a multitude of different ways, for example, as defined and covered by the claims or select examples. For example, while descriptions provided herein refer to three-level current steering DACs, in general, current sources that utilize the phenomenon of current memory as described herein may be implemented in current steering DAC cells that are not necessarily three-level, as well as systems other than DACs and DAC cells.

As will be appreciated by one skilled in the art, aspects of the present disclosure, in particular aspects of controlling current sources using switching techniques that utilize current memory, e.g., in context of current steering DACs, as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or DAC controllers, etc.) or be stored upon manufacturing of these devices and systems.

In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the numerous examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Other features and advantages of the disclosure are apparent from the following description, the select examples, and the claims.

Basics of Three-Level DACs

As briefly described above, some current steering DACs may employ three-level current steering DAC cells configured to respond to three levels of digital input: +1, 0, and −1. FIG. 1 illustrates an electric circuit diagram of an example return-to-hold, a 16-bit, three-level, thermometer code current steering DAC 100, according to prior art. It is typical that a DAC employs multiple DAC cells, e.g., 16 DAC cells shown in the example of FIG. 1, labeled as "DAC cell 0" through "DAC cell 15." As shown in FIG. 1, each DAC cell includes a pair of current sources 112 and 122, e.g., a first current source (e.g., a positive current source) 112-0 and a second current source (e.g., a negative current source) 122-0 for the DAC cell 0, and so on. As also shown in FIG. 1, each DAC cell includes a plurality of switches per current source. In particular, FIG. 1 illustrates that the first current source 112 of each DAC cell is coupled to a plurality of switches 114 (shown in FIG. 1 as three switches, within a dashed box labeled as "114") controlled with respective control signals (different control signals controlling individual switches shown in FIG. 1 are labeled as control signals "pos," "neg," and "z"), while the second current source 122 of each DAC cell is coupled to a plurality of switches 124 (also shown in FIG. 1 as three switches, within a dashed box labeled as "124"), controlled by the same control signals "pos," "neg," and "z" as the switches 114 of the first current source 112.

The use of reference numbers in FIG. 1 and the subsequent drawings is such that when multiple instances of a substantially the same element are shown, the reference numbers indicate different instances with numbers after a dash (e.g., the first current source of the DAC cell 0 is shown as a current source 102-0, the first current source of the DAC cell 15 is shown as a current source 102-15, the second current source of the DAC cell 0 is shown as a current source 104-0, the second current source of the DAC cell 15 is shown as a current source 104-15, and so on). In some descriptions, various switches described herein may be referred to by the names of the control signals controlling those switches, e.g., the switches 114 of the DAC cell 0 (i.e., the switches 114-0) may be referred to as switches pos0, neg0, and z0, the switches 114 of the DAC cell 15 (i.e., the switches 114-15) may be referred to as switches pos15, neg15, and z15, and so on. Thus, some elements of the drawings are referred to with both letters and drawings, e.g., switches labeled as "pos," "neg," and "z," in which case different instances of these elements are labeled with numbers after the letters (e.g., the switches "pos" of the DAC cell 0 are shown as "pos0," the switches "pos" of the DAC cell 15 are shown as "pos15," and so on).

FIG. 1 further illustrates a reference voltage source 120 and a summing component 130. In some embodiments, the summing component 130 may be implemented as an amplifier A1, having positive and negative summing junctions (SJs), labeled as, respectively, SJP and SJN. As can be seen from FIG. 1, each pair of current sources 112, 122 may be connected to the summing component 130 in three different ways, each pair may contribute a positive quantity of charge (e.g., when one of the switches 114 labeled as "pos" is closed and one of the switches 124 labeled as "pos" is closed, i.e., these two switches of a given DAC cell controlled by the same control signal pos), a negative quantity of charge (e.g., when one of the switches 114 labeled as "neg" is closed and one of the switches 124 labeled as "neg" is closed, i.e., these two switches of a given DAC cell controlled by the same control signal neg), or nothing at all (e.g., when one of the switches 114 labeled as "z" is closed and one of the switches 124 labeled as "z" is closed, i.e., these two switches of a given DAC cell controlled by the same control signal z). When the data input to a given DAC cell of the DAC 100 is 0, both current sources 112, 122 are coupled to the reference voltage source 120, which may, e.g., be implemented as a buffer amplifier, to maintain their proper drain voltage (the voltage is referred to as a "drain" voltage because the current sources 112, 122 are implemented as FETs, having their drain terminals coupled to the switch z of, respectively, the switches 114 and 124, which switches may couple the current sources to the reference voltage source 120).

For each DAC cell of the DAC 100, in response to receiving a digital input of 1 (i.e., to convert a digital value of 1), switches pos of the switches 114 and 124 are closed while switches neg and of the switches 114 and 124 are open; in response to receiving a digital input of −1 (i.e., to convert a digital value of −1), switches neg of the switches 114 and 124 are closed while switches pos and z of the switches 114 and 124 are open; and, in response to receiving a digital input of 0 (i.e., to convert a digital value of 0), switches z of the switches 114 and 124 are closed while switches pos and neg of the switches 114 and 124 are open.

Figure 2:
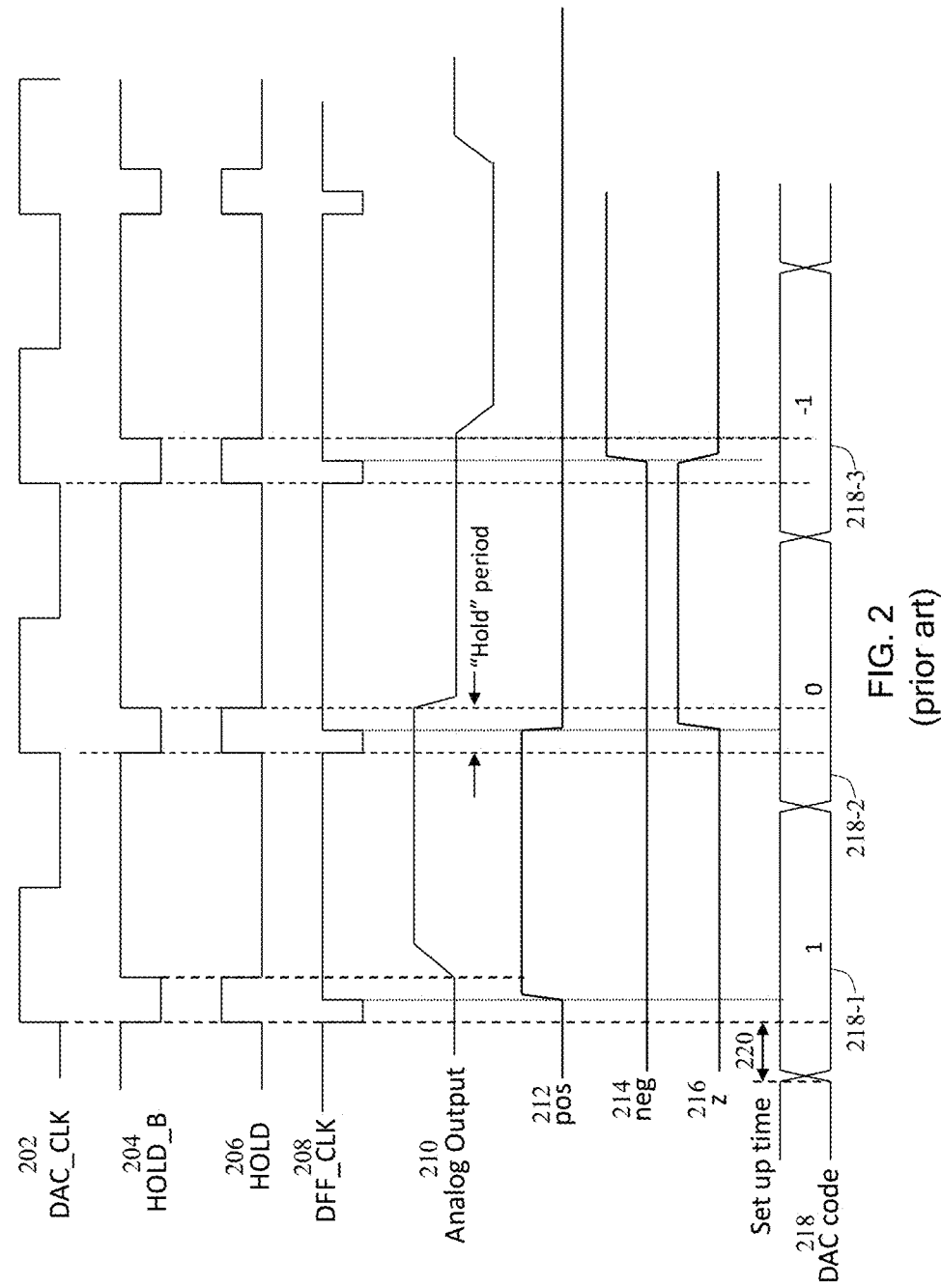
FIG. 2 illustrates a timing diagram for operating a DAC cell of the DAC shown in FIG. 1.

FIG. 1 further illustrates that a return-to-hold (RTH) technique may be applied to three-level DACs by the addition of switches S1 (labeled as a switch 142), S2 (labeled as a switch 144), and S3 (labeled as a switch 146). In the DAC 100 of FIG. 1, the switches S1 and S2 are controlled by a control signal labeled as a signal "HOLD_B" while the switch S3 is controlled by a control signal labeled as a signal "HOLD" (signals HOLD and HOLD_B may be complementary, e.g., when one signal is HIGH, the other signal may be low, and vice versa). FIG. 1 further illustrates feedback resistors R1 and R2, and capacitors C1 and C2. The timing diagram of the clock, the current cell control bits and the control signals are shown in FIG. 2.

The operation of the DAC 100 shown in FIG. 1 may be described as follows. When the rising edge of the clock 202 arrives, HOLD_B 204 becomes LOW and disconnects the feedback resistors R1 and R2 from the summing component 130 by turning off the switches S1 and S2. At the same time, HOLD 206 becomes HIGH and connects the terminals of the resistors R1 and R2 shown in FIG. 1 on the left-hand side via the switch S3. The outputs of the different DAC cells are also short-circuited together via the switch S3. This period may be referred to as a "hold" period because in this time period the summing component 130 is in the "hold" mode in that its output voltage is kept at the same value by the capacitors C1 and C2. Since resistors R1 and R2 are connected across the positive and negative outputs of the summing component 130, the mid-point of this resistor string (the terminals of the switch S3) may be set at the output common-mode (CM) voltage of the amplifier A1 of the summing component 130. Since the outputs of the different DAC cells are connected to this point, the amplifier A1 is acting as a CM buffer and holds their drains at the CM level, eliminating the need for an extra CM buffer.

For the circuit of FIG. 1, during the "hold" period, DAC flip-flop output is changed in response to change of the DAC code. The change of flip-flop output is not expressly shown in FIG. 2, but what is shown in FIG. 2 is the change in DAC code 218, i.e., changing of the digital input values to a DAC cell. This change happens a little bit before the hold periods, with an offset that may be referred to as a "set-up time" 220, which is a time it takes to set up the change in D-flip flop output in response to the change of the DAC code.

While, during the "hold" period, DAC flip-flop output is changed in response to change of the DAC code, analog output 210 is unchanged since the feedback resistor R1 and R2 are still disconnected from the positive and negative summing junctions SJP and SJN. When the "hold" period ends, the switch S3 is opened, and the switches S1 and S2 are closed. Resistors R1 and R2 become coupled to, respectively, the SJP and SJN, allowing the DAC current to be converted to the output voltage by the amplifier A1. Since the DAC flip-flop output changes during the "hold" period, the output has substantially no information or memory about the rise and fall time of each individual switching current cell and the output voltage may be free of inter-symbol interference.

For each DAC cell of the DAC 100 (i.e., for each of the bits 0-15 shown in FIG. 1), in response to receiving a digital input of 1 (i.e., to convert a digital value of 1), switches pos of the switches 114 and 124 are closed while switches neg and z of the switches 114 and 124 are open. This is illustrated in FIG. 2 with a control signal 212 for the switches pos associated with the first and second current sources of the DAC cell being in a HIGH state, while a control signal 214 for the switches neg and a control signal 216 for the switches z both being in a LOW state when the DAC code 218 is a digital value of 1 (that digital value of the input DAC code 218 labeled in FIG. 2 with a reference numeral 218-1).

Similarly, in response to receiving a digital input of 0 (i.e., to convert a digital value of 0), switches z of the switches 114 and 124 are closed while switches pos and neg of the switches 114 and 124 are open. This is illustrated in FIG. 2 with the control signal 216 for the switches z associated with the first and second current sources of the DAC cell being in a HIGH state, while the control signal 212 for the switches pos and the control signal 214 for the switches neg both being in a LOW state when the DAC code 218 is a digital value of 0 (that digital value of the input DAC code 218 labeled in FIG. 2 with a reference numeral 218-1).

Finally, in response to receiving a digital input of −1 (i.e., to convert a digital value of −1), switches neg of the switches 114 and 124 are closed while switches pos and z of the switches 114 and 124 are open. This is illustrated in FIG. 2 with the control signal 214 for the switches neg associated with the first and second current sources of the DAC cell being in a HIGH state, while the control signal 212 for the switches pos and the control signal 216 for the switches z both being in a LOW state when the DAC code 218 is a digital value of −1 (that digital value of the input DAC code 218 labeled in FIG. 2 with a reference numeral 218-3).

As shown in FIG. 2, the control signals 212, 214, and 216 are only making their transitions when the HOLD signal 206 is HIGH, at which time the amplifier A1 is in the "hold" stage where its voltage remains constant, ensuring that the switches are switched only during the hold periods. The DAC 100 may combine advantages provided by the use of an RTH scheme, such as reducing disturbance to the summing junctions of the amplifier (which may be essential for high-speed operations) and being insensitive to any variation in HOLD_B pulse width, and advantages provided by the use of three-level logic, such as reducing noise and increasing signal-to-noise (SNR) ratio.

Figure 3:
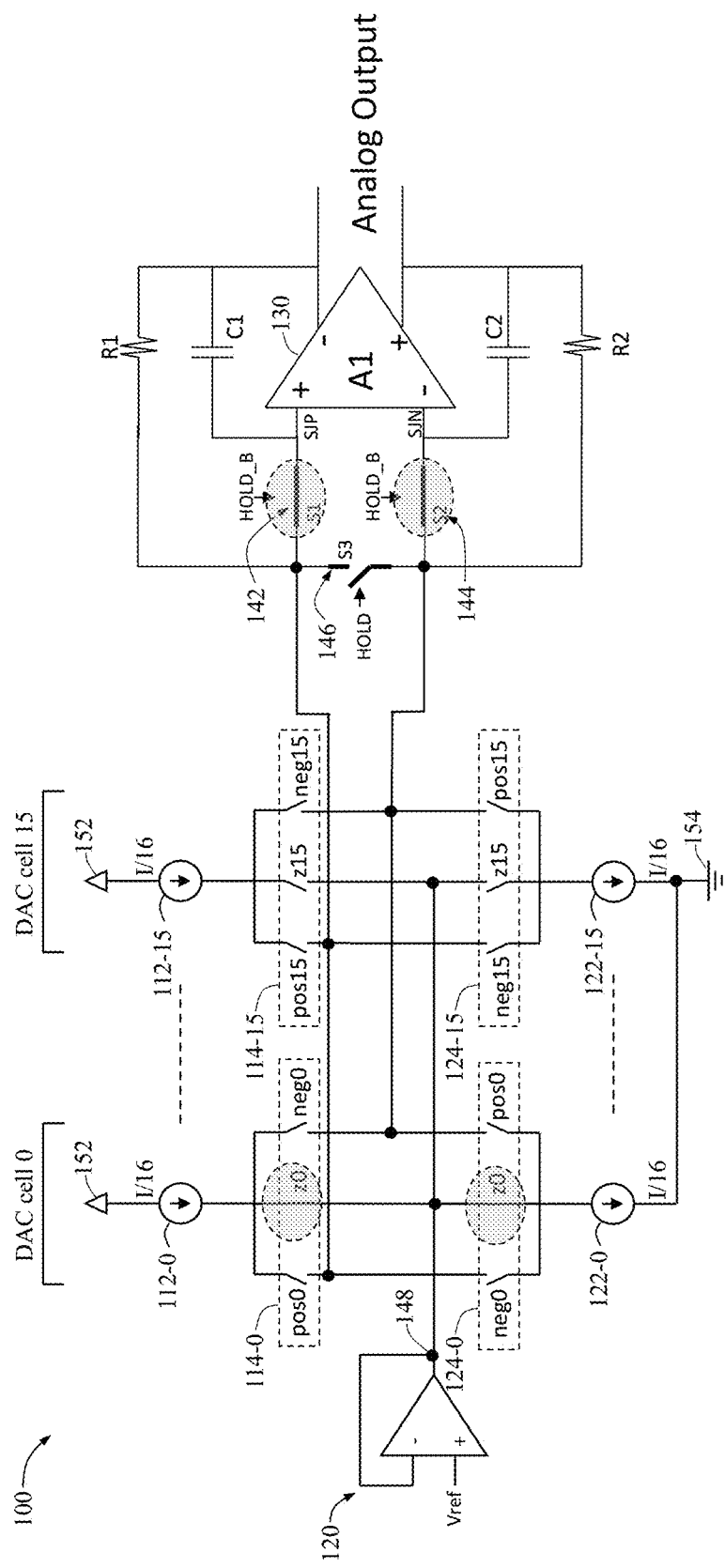
FIG. 3 illustrates an electric circuit diagram of the DAC shown in FIG. 1 with switches being in a state corresponding to the conversion of a zero digital value.

Inventors of the present disclosure that the DAC 100 may be improved further. In particular, inventors realized that when a digital value of 0 is being converted by a given DAC cell, the first and second current sources of that DAC cell are connected to a CM node 148 of the buffer amplifier 120 and the current is flowing from the supply coupled to that DAC cell (e.g., the supply 152, shown in FIG. 1) to the ground potential, also coupled to that DAC cell (e.g., the ground 154, shown in FIG. 1). An example of such a scenario is shown in FIG. 3, illustrating an electric circuit diagram of the DAC 100 but with the switches being in a state corresponding to the conversion of a zero digital value by the DAC cell 0. The changes with respect to FIG. 1 are highlighted in FIG. 3 by the use of shaded ovals with dashed outlines (i.e., at the switch z0 of the switch 114, the switch z0 of the switch 124, and the switches 142 and 144). The current flowing between the first current source 112-0 and 122-0 when the digital input of 0 is being converted by the DAC cell 0 is wasted. Such currents may add up to a significant portion of power consumption of the DAC cell 100.

Figures 4, 5:
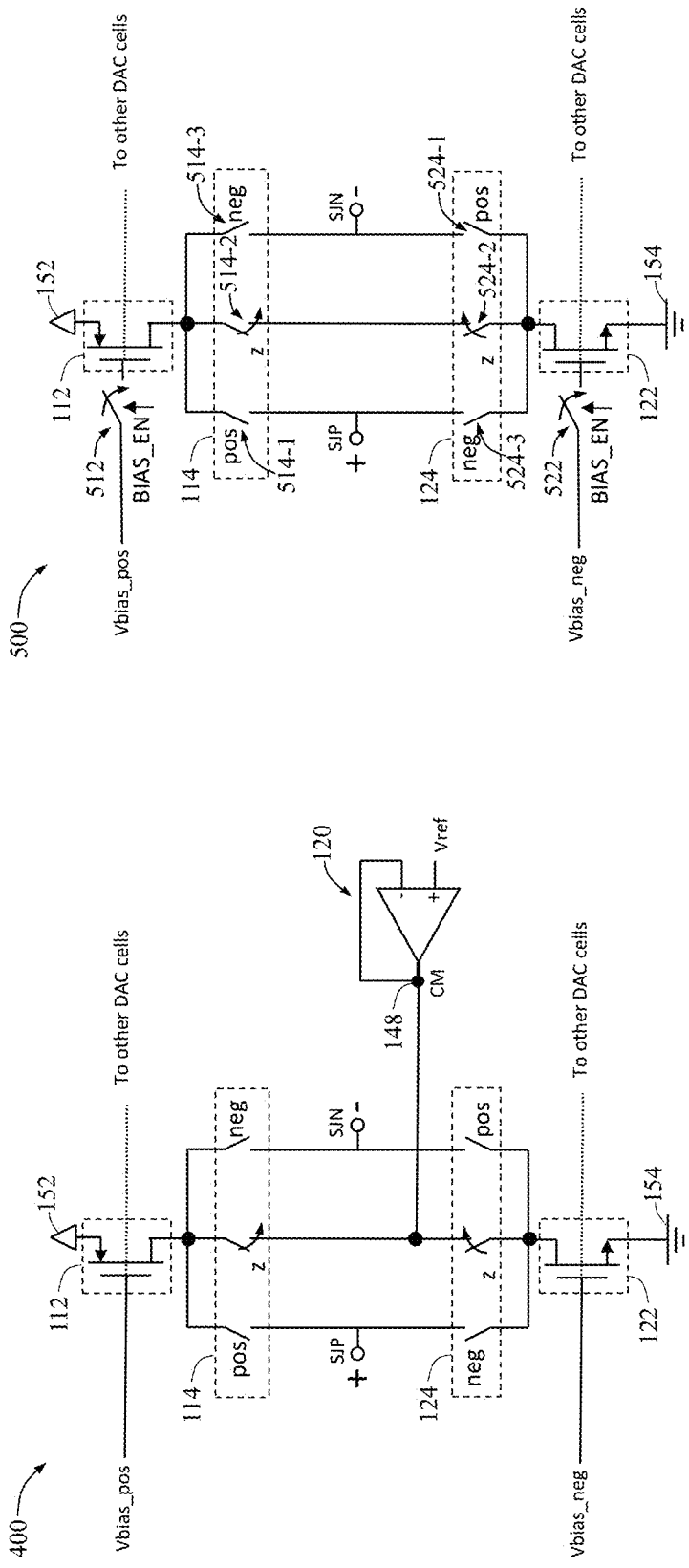
FIG. 4 illustrates an electric circuit diagram of an example DAC cell of the DAC shown in FIG. 1.
FIG. 5 illustrates an electric circuit diagram of an example DAC cell configured to utilize current memory, according to some embodiments of the disclosure.

FIG. 4 illustrates an electric circuit diagram of an example DAC cell 400 of the DAC 100 shown in FIG. 1, where reference numerals used in FIG. 1 are used to designate the same or analogous elements in the illustration of FIG. 4, so that their descriptions are not repeated again here, except that the indications of a particular DAC cell, provided in FIG. 1 to differentiate between the different DAC cells of the DAC 100 are not shown in FIG. 4 because only a single DAC cell is shown in FIG. 4. FIG. 4 further illustrates the details of the current sources 112 and 122, illustrating that they may be implemented as a PMOS transistor and an NMOS transistor, respectively. The analysis above may suggest that the way to reduce the power consumption of the DAC cell 100 would be to disconnect the gate voltages from the current sources 112 and 122, the gate voltages shown in FIG. 4 as gate voltages Vbias_pos for the current source 112 and Vbias_neg for the current source 122, or connect these voltages to ground, when the DAC cell 400 is operating to convert the digital input of 0. However, inventors of the present disclosure further realized that doing so may create significant transient issues in that the bias voltage sources typically implemented in such DAC cells, the bias voltage sources usually implemented as low-noise amplifiers (LNAs), cannot bring the gate voltage up to the steady state level fast enough (because these sources are low-noise, low-bandwidth amplifiers). This transient may then cause severe degradation in THD and noise performance. One may then consider to implement one of the look-ahead techniques that can indicate if the next digital input to the DAC cell 400 may be a zero digital input in an attempt to reduce the transient problems. However, even with such look-ahead techniques, capacitors may be required to suppress any disturbances caused by the switching transient, which may be a major drawback as it requires extra pins and external parts and, hence, may be regarded as a cost-prohibitive solution.

Switching Techniques Utilizing Current Memory

Embodiments of the present disclosure provide improved switching techniques for controlling three-level DAC cells that may employ an RTH scheme. In particular, disclosed techniques are based on recognition that decoupling the current sources of a three-level DAC cell both from their respective bias sources and from a load when converting a zero digital input, where the decoupling is performed in a certain order, and coupling the current sources to their respective bias sources and to the load when converting a non-zero digital input (i.e., a digital input of +1 or −1), again, in a certain order, may allow power reduction by disconnecting the current sources while providing a significant improvement on the transient problem described above that may otherwise be caused by disconnecting the bias sources. The certain order of disconnecting and connecting the bias sources and the load to the current sources of a DAC cell are based on the phenomenon of current memory in FETs. In this manner, power consumption may be reduced while preserving the high-performance properties of a three-level current steering DAC. Improved switching techniques that utilize current memory effect will now be explained with reference to FIGS. 5-11.

FIG. 5 illustrates an electric circuit diagram of an example DAC cell 500 configured to utilize current memory, according to some embodiments of the disclosure. FIG. 5 uses some reference numerals that were used in FIG. 4 to illustrate the same or analogous elements as those of FIG. 4, so that, in the interests of brevity, their full descriptions are not repeated for FIG. 5 and the description of FIG. 5 may focus on the differences with FIG. 4 instead.

As shown in FIG. 5, in contrast to the DAC cell 400, the DAC cell 500 includes a first switch 512, configured to, in response to a control signal BIAS_EN (short for "bias enable"), connect and disconnect the first current source 112 from its' bias voltage Vbias_pos provided by a first bias voltage source (the first bias voltage source not specifically shown in FIG. 5). As also shown in FIG. 5, also in contrast to the DAC cell 400, the DAC cell 500 further includes a second switch 522, configured to, in response to the control signal BIAS_EN, connect and disconnect the second current source 122 from its' bias voltage Vbias_neg provided by a second bias voltage source (the second bias voltage source also not specifically shown in FIG. 5). The control signal provided to the switches 512 and 522 is shown as the same signal BIAS_EN to indicate that the switches 512 and 522 are connected and disconnected to their bias signals at the same time, although the values of their bias signals may be different (as indicated in FIG. 5 with the bias signals for the switches 512 and 522 being labeled with different labels— Vbias_pos and Vbias_neg, respectively). A further difference between the DAC cell 500 and the DAC cell 400 is that the DAC cell 500 does not need to be coupled to a buffer amplifier that would maintain the drain voltage at the drain terminals of the current sources 112 and 122, thus eliminating a component, which is always advantageous in terms of reduced complexity, power consumption, and die area occupied by the circuit.

FIG. 5 illustrates reference numerals 514-1 and 524-1 referring to, respectively, a switch of the switches 114 that is controlled by a control signal pos and a switch of the switches 124 that is controlled by the same control signal pos. FIG. 5 further illustrates reference numerals 514-2 and 524-2 referring to, respectively, a switch of the switches 114 that is controlled by a control signal z and a switch of the switches 124 that is controlled by the same control signal z. Still further, FIG. 5 illustrates reference numerals 514-3 and 524-3 referring to, respectively, a switch of the switches 114 that is controlled by a control signal neg and a switch of the switches 124 that is controlled by the same control signal neg. The pos switches 514-1 and 524-1, the z switches 514-2 and 524-2, and the neg switches 514-3 and 524-3 of the DAC cell 500 are substantially the same as those shown in FIG. 4, except that they are now designated with reference numerals so that their switching/operation may be described in greater detail.

Figure 6:
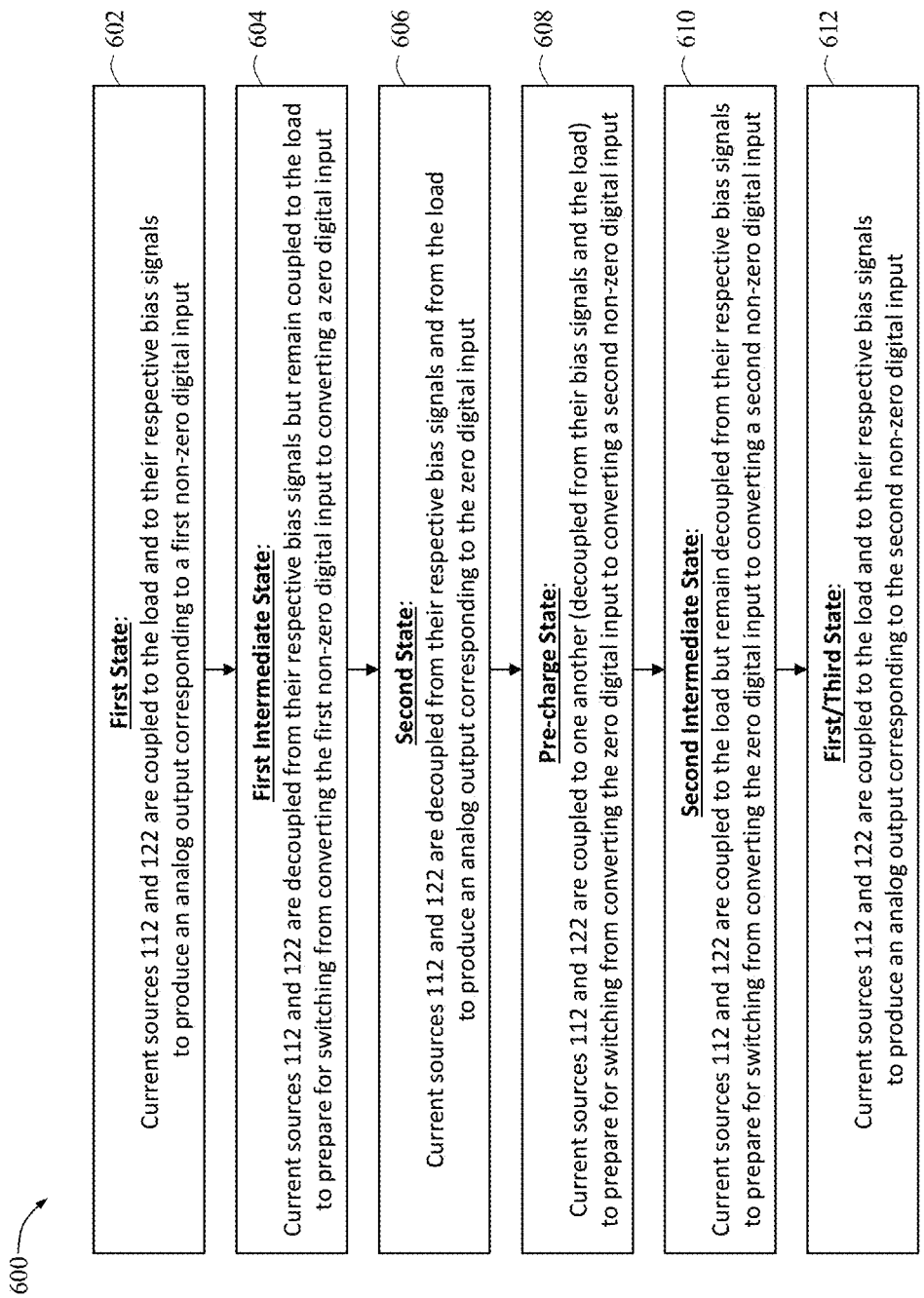
FIG. 6 illustrates a flow diagram of a method that provides a switching technique to control the DAC cell of FIG. 5 in a manner that utilizes current memory, according to some embodiments of the disclosure.

FIG. 6 illustrates a flow diagram of a method 600 that provides a switching technique to control the DAC cell 500 in a manner that utilizes current memory, according to some embodiments of the disclosure. In FIG. 6, references are made to different states of the DAC cell 500. These states differ in what the current sources of the DAC cell 500 are coupled to. Therefore, these states may, alternatively, be described as states of the current sources 112 and 122 of the DAC cell 500. The method 600 will now be described with reference to FIGS. 7-9.

FIGS. 7A-7F illustrate different states of the DAC cell of FIG. 5 when switching according to the method 600 of FIG. 6 is performed, according to some embodiments of the disclosure. In FIGS. 7A-7F, shaded ovals with dashed outlines are used to highlight the switches which are closed.

Figure 8:
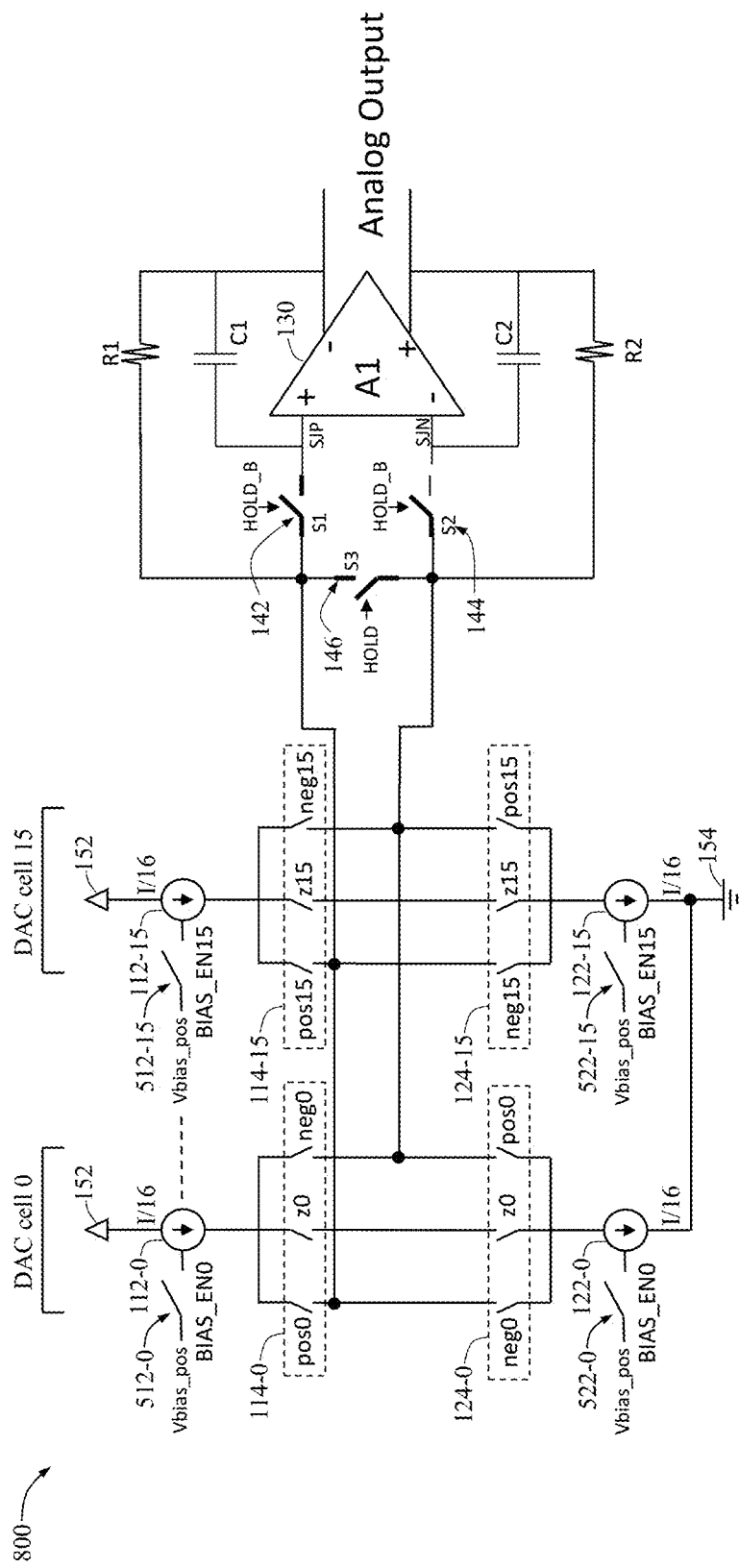
FIG. 8 illustrates an electric circuit diagram of an example three-level current steering DAC employing one or more of the DAC cells of FIG. 5, according to some embodiments of the disclosure.

FIG. 8 illustrates an electric circuit diagram of an example three-level current steering DAC 800 employing one or more of the DAC cells 500 of FIG. 5, according to some embodiments of the disclosure. FIG. 8 uses some reference numerals that were used in FIG. 1 to illustrate the same or analogous elements as those of FIG. 1, so that, in the interests of brevity, their full descriptions are not repeated for FIG. 8 and the description of FIG. 8 may focus on the differences with FIG. 1 instead. In particular, the DAC 800 illustrates that each of the DAC cells 0-15 may be implemented as the DAC cell 500, where the current sources 112 and 122 of each DAC cell may be coupled and decoupled from their respective bias signals using the switches 512 and 522, as described herein. In some such embodiments, the current sources 112 of one or more, e.g., all, of the DAC cells may be coupled to the same bias signal source (not shown in FIG. 8), configured to provide the bias signal Vbias_pos, where the current sources 112 of the individual DAC cells may be coupled and decoupled from that bias signal source as needed using their respective switches 512. Similarly, the current sources 122 of one or more, e.g., all, of the DAC cells may be coupled to the same bias signal source (not shown in FIG. 8), configured to provide the bias signal Vbias_neg, where the current sources 122 of the individual DAC cells may be coupled and decoupled from that bias signal source as needed using their respective switches 522. When all DAC cells of the DAC 800 are implemented as the DAC cells 500, the buffer amplifier 120 of the DAC 100 may be eliminated from the DAC 800, as illustrated in FIG. 8. In other embodiments of the DAC 800 (not specifically shown in FIG. 8), only some (e.g., one or more) of the DAC cells of the DAC 800 may be implemented as the DAC cell 500, while the other DAC cells may be implemented as the DAC cell 100. In such embodiments, the buffer amplifier 120 may be included in the DAC 800 but only be coupled to the DAC cells that are implemented as the DAC cell 400.

Figure 9:
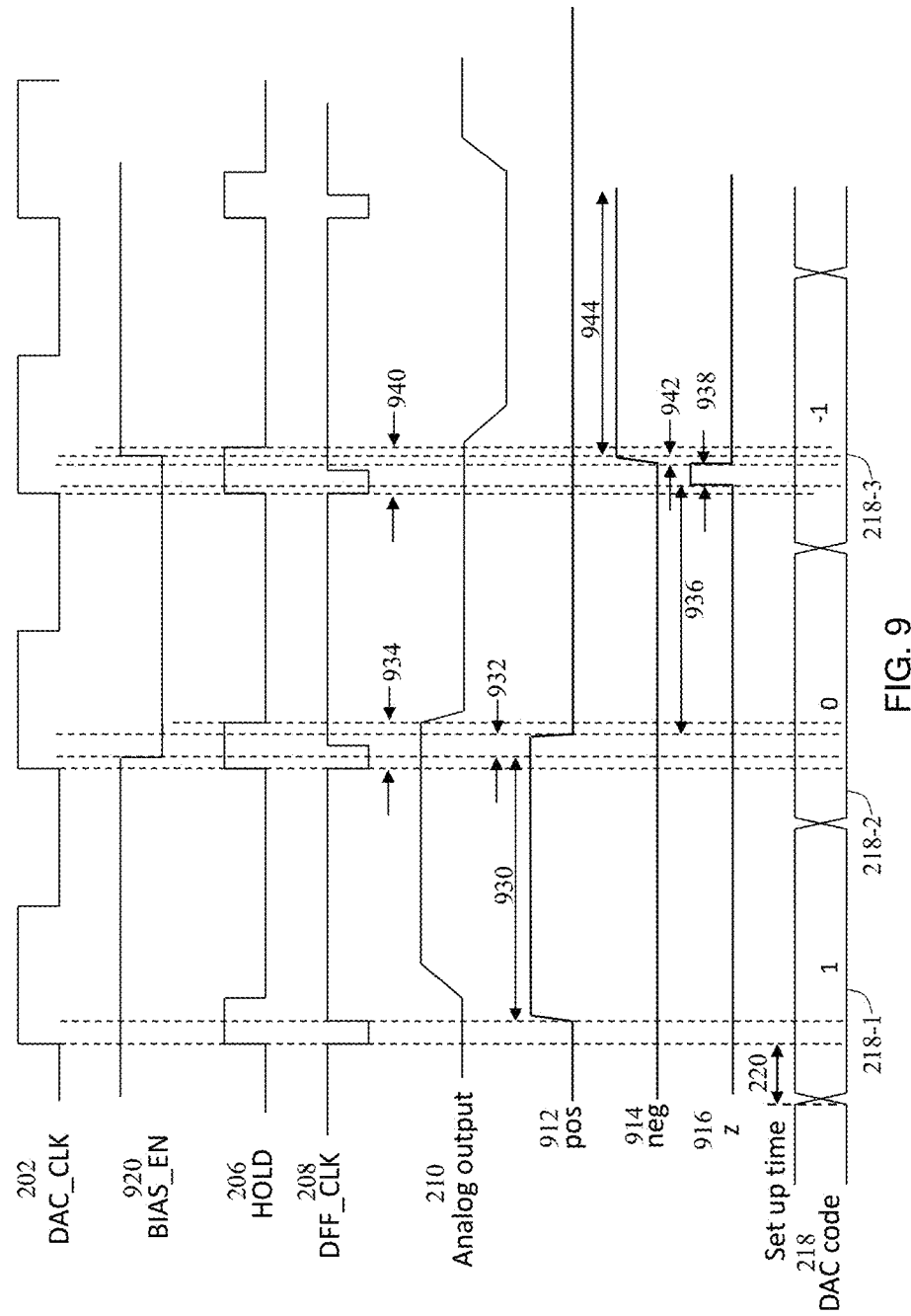
FIG. 9 illustrates a timing diagram for operating a DAC cell configured to utilize current memory in the DAC of FIG. 8, according to some embodiments of the disclosure.

FIG. 9 illustrates a timing diagram for operating one of the DAC cells 500 in the DAC 800 of FIG. 8, according to some embodiments of the disclosure. FIG. 9 uses some reference numerals that were used in FIG. 2 to illustrate the same or analogous elements as those of FIG. 2, so that, in the interests of brevity, their full descriptions are not repeated for FIG. 9 and the description of FIG. 9 may focus on the differences with FIG. 2 instead. In particular, FIG. 9 illustrates that the switching of the DAC cell 500 included in the DAC 800 differs from the switching of the DAC cell 400 included in the DAC 100 (which was shown in FIG. 2) in the control signal z for the switches 514-2 and 524-2, the control signal z shown in FIG. 9 as a signal 916. FIG. 9 also illustrates control signals 912 and 914 for controlling, respectively, the switches 514-1/524-1 and switches 514-3/524-3, which are similar to the control signals 212 and 214, shown in FIG. 2, although their timing may be slightly different. Furthermore, FIG. 9 illustrates the timing of the control signal BIAS_EN, configured to control coupling and decoupling of the current sources 112 and 122 to and from their respective bias signal sources, the control signal BIAS_EN shown in FIG. 9 as a signal 920.

Turning to FIG. 6, the method 600 may begin with 602, where the DAC cell 500 is in a first state, where the "first state" is a state of the DAC cell 500 where the current sources 112 and 122 are coupled to their load (e.g., to a summing component that combines outputs of different DAC cells of a DAC, e.g., to the amplifier A1) and to their respective bias signals Vbias_pos and Vbias_neg to produce an analog output corresponding to a first non-zero digital input. This scenario is illustrated in FIG. 7A, showing a DAC cell 702 which is the DAC cell 500 in the first state for the example where the first non-zero digital input is the digital input of +1. The time period during which the DAC cell 500 is in the first state as shown in FIG. 7A is shown as a time period 930 in FIG. 9. FIG. 9 illustrates that the time period 930 is measured from the time when the control signal 912 becomes HIGH to convert the first digital input 218-1, until the time when the BIAS_EN signal 920 for the conversion of the first digital input 218-1 becomes LOW. In this case, the switches 512 and 522 are closed to couple the current sources 112 and 122 to their respective bias signals Vbias_pos and Vbias_neg, and the switches 514-1 and 524-1 are closed to couple, respectively, the current source 112 to the positive summing junction SJP of the amplifier A1 of the DAC 800 and the current source 122 to the negative summing junction SJN of the amplifier A1 of the DAC 800. In this state, the switches 514-2 and 524-2 are open, so that there is no current flow path between the first current source 112 and the second current source 124, and the switches 514-3 and 524-3 are open as well. In this state, the DAC cell 702 is configured to generate an analog output corresponding to a conversion of a digital input +1, which analog output may be provided to the summing junctions SJP and SJN of the amplifier A1 of the DAC 800, as was described above with reference to the DAC cell 100 of FIG. 1.

In other embodiments, the first non-zero digital input converted in 602 of the method 600 may be the digital input of −1. The descriptions provided with respect to 602 would still be equally applicable except that, in this case, it would be the switches 514-3 and 524-3 that would be closed and the switches 514-1 and 524-1 would be open and the timing diagram of FIG. 9 would be modified so that the control signal 912 is LOW and the control signal 914 is HIGH instead, with the time period 930 being measured from the time when the control signal 914 becomes HIGH until the time when the BIAS_EN signal 920 for the conversion of the first digital input becomes LOW.

After the first non-zero digital input has been converted and when the next digital input to be converted is a zero digital input (i.e., the digital input of 0, as shown in the example of FIG. 9 with the digital input 218-2 being the digital input of 0), the method 600 may proceed with 604, where the DAC cell 500 is placed in a first intermediate state, where the "first intermediate state" is a state of the DAC cell 500 where the current sources 112 and 122 decoupled from their respective bias signals Vbias_pos and Vbias_neg but are still coupled to their load. This is done in preparation for switching from converting the first non-zero digital input (e.g., the digital input 218-1, shown in FIG. 9) to converting a zero digital input (e.g., the digital input 218-2, shown in FIG. 9). This scenario is illustrated in FIG. 7B, showing a DAC cell 704 which is the DAC cell 500 in the first intermediate state for the example where the first non-zero digital input that was previously converted was the digital input of +1. The time period during which the DAC cell 500 is in the first intermediate state as shown in FIG. 7B is shown as a time period 932 in FIG. 9. FIG. 9 illustrates that the time period 932 is measured from the time when the BIAS_EN signal 920 for the conversion of the first digital input 218-1 becomes LOW until the time when the control signal 912 becomes LOW to finish converting the first digital input 218-1 and to prepare for the conversion of the second digital input 218-2. In 604, the switches 512 and 522 are opened (as shown in FIG. 9 with the control signal BIAS_EN 920 being LOW in the time period 932) to decouple the current sources 112 and 122 from their respective bias signals Vbias_pos and Vbias_neg, while the switches 514-1 and 524-1 remain closed (as shown in FIG. 9 with the control signal pos 912 still being HIGH in the time period 932), coupling, respectively, the current source 112 to the positive summing junction SJP of the amplifier A1 and the current source 122 to the negative summing junction SJN of the amplifier A1. In this state, the switches 514-2 and 524-2 as well as the switches 514-3 and 524-3 remain open. Similar to the first state, there is no current flow between the first current source 112 and the second current source 124 when the DAC cell 500 is in the first intermediate state.

Because the current sources 112, 122 remain coupled to the summing junctions of the amplifier A1 (by virtue of their switches 514-1 and 524-1 remaining closed) when the DAC cell 500 is in the first intermediate state, the voltages on their drain terminals (i.e., on the terminals which are coupled to the switches 114 and 124, respectively) may be maintained even though the bias signals are disconnected from their gate terminals. Because the time period 932 is within the hold period (labeled in FIG. 9 as a hold period 934), i.e., when the switch 146 of the DAC 800 is closed (i.e., the HOLD signal 206, shown in FIG. 9, is HIGH) and the switches 142 and 144 of the DAC 800 are open (i.e., the HOLD_B signal, not shown in FIG. 9, but being the complementary to the HOLD signal, thus being LOW), the analog output 210 is unchanged since the feedback resistor R1 and R2 are still disconnected from the positive and negative summing junctions SJP and SJN. Thus, the analog output 210 is still indicative of the conversion of the first digital input 218-1. Thus, in the first intermediate state that has a duration of the time period 932, the DAC cell 704 continues to generate an analog output corresponding to a conversion of a digital input +1, which analog output may be provided to the summing junctions SJP and SJN of the amplifier A1, as was described above with reference to the DAC cell 100 of FIG. 1.

In the embodiments where the first non-zero digital input converted in 602 of the method 600 was the digital input of −1, the descriptions provided with respect to 604 would still be equally applicable except that, in this case, it would be the switches 514-3 and 524-3 that would remain closed during the time period 932 (i.e., the control signal 914 would stay HIGH) and the switches 514-1 and 524-1 would be open (i.e., the control signal 912 would stay LOW), and the timing diagram of FIG. 9 would be modified so that the control signal 914 becomes LOW at the end of the time period 932.

Next, the method 600 may continue with 606, where the DAC cell 500 is placed in a second state, where the "second state" is a state of the DAC cell 500 where the current sources 112 and 122 are decoupled from their respective bias signals Vbias_pos and Vbias_neg, as well as from their load, to produce an analog output corresponding to the zero digital input. This scenario is illustrated in FIG. 7C, showing a DAC cell 706 which is the DAC cell 500 in the second state. The time period during which the DAC cell 500 is in the second state as shown in FIG. 7C is shown as a time period 936 in FIG. 9. FIG. 9 illustrates that the time period 936 is measured from the time when the control signal 912 becomes LOW to finish converting the first digital input 218-1, until the time when the switches 514-2 and 524-2 become temporarily closed to provide a current path between the current sources 112 and 122 (i.e., until the control signal 916 becomes HIGH). During the time period 936, the switches 512 and 522 remain open to decouple the current sources 112 and 122 from their respective bias signals Vbias_pos and Vbias_neg, and all of the switches 114 and 124 are open to decouple the current sources 112, 122 from one another and from the amplifier A1 of the DAC 800. In this time, the drain voltages of the current sources 112 and 122 drift to, respectively, the supply voltage and the ground (i.e., the drain voltage of the current source 112, e.g., the NMOS transistor, drifts to the supply voltage because this current source is coupled to the supply 152, and the drain voltage of the current source 122, e.g., the PMOS transistor, drifts to the ground potential because this current source is coupled to the ground 154). The gate capacitance of the current sources 112, 122 may still store the charge (possibly with some small change due to charges drawn from the drain-gate capacitance, Cdg, when the drain voltage settled during this state). However, the current sources 112, 122 are effectively acting as "current memory cells" in sleep mode when the DAC cell 500 is in the second state. Because in this state the switches 514-2 and 524-2 are open, there is still no current flow path between the first current source 112 and the second current source 124. In this state, the DAC cell 500 is not contributing any analog output to the amplifier A1 of the DAC 800, which effectively corresponds to the analog output resulting from the conversion of the value 0. Power consumption may be reduced because there is no current flowing in the DAC cell 500 at least during the time period 936 when the digital input of 0 is being converted.

When, after converting one or more consecutive 0 digital inputs, the next digital input to be converted is a non-zero digital input (e.g., a +1 or a −1), the method 600 may continue with 608, where the DAC cell 500 is placed in a pre-charge state, where the "pre-charge state" is a state of the DAC cell 500 where the current sources 112 and 122 are still decoupled from their respective bias signals Vbias_pos and Vbias_neg, as well as from their load, and the switches 514-1/524-1 and 514-3/524-3 remain open as in the second state, but the switches 514-2 and 524-2 become closed to provide a current path between the current sources 112 and 122. This is done in preparation for switching from converting the zero digital input (e.g., the digital input 218-2, shown in FIG. 9) to converting a second non-zero digital input (e.g., the digital input 218-3, shown in FIG. 9). This scenario is illustrated in FIG. 7D, showing a DAC cell 708 which is the DAC cell 500 in the pre-charge state. The time period during which the DAC cell 500 is in the pre-charge state as shown in FIG. 7D is shown as a time period 938 in FIG. 9. FIG. 9 illustrates that the time period 938 is measured from the time when the switches 514-2 and 524-2 become temporarily open to provide a current path between the current sources 112 and 122 (i.e., the control signal 916 is HIGH) until the time when the switches 514-2 and 524-2 are closed again to disrupt the current path between the current sources 112 and 122 (i.e., until the control signal 916 becomes LOW). During the time period 938, the switches 514-2 and 524-2 are closed so that current may flow between the current sources 112 and 122 to partially restore the drain voltages of the current sources 112 and 122. For the DAC cell 400, the buffer amplifier 120 was used to restore the drain voltages of the current sources 122. For the DAC cell 500, the need for the buffer amplifier 120 is advantageously eliminated because the pre-charge state 608 of the method 600 may perform this function. In this state, same as in the second state, the DAC cell 500 is still not contributing any analog output to the amplifier A1 of the DAC 800. Because the time period 938 is within a hold period, e.g. a hold period 940, shown in FIG. 9, the switch 146 of the DAC 800 is closed (i.e., the HOLD signal 206, shown in FIG. 9, is HIGH) and the switches 142 and 144 of the DAC 800 are open (i.e., the HOLD_B signal, not shown in FIG. 9, but being the complementary to the HOLD signal, thus being LOW), the analog output 210 remains unchanged and is still indicative of the conversion of the zero digital input 218-2.

After the drain voltages of the current sources 112 and 122 have been at least partially re-stored during the pre-charge period 938, the method 600 may continue with 610. In 610, preparation for switching from converting the zero digital input (e.g., the digital input 218-2, shown in FIG. 9) to converting a second non-zero digital input (e.g., the digital input 218-3, shown in FIG. 9) continues. To that end, the DAC cell 500 is placed in a second intermediate state, where the "second intermediate state" is a state of the DAC cell 500 where the current sources 112 and 122 are still decoupled from their respective bias signals Vbias_pos and Vbias_neg but are now coupled to their load. One example of this scenario is illustrated in FIG. 7E, showing a DAC cell 710 which is the DAC cell 500 in the second intermediate state for the example where the second non-zero digital input to be converted next is the digital input of −1. The time period during which the DAC cell 500 is in the second intermediate state as shown in FIG. 7E is shown as a time period 942 in FIG. 9. FIG. 9 illustrates that the time period 942 is measured from the time when the switches 514-2 and 524-2 were closed to disrupt the current path between the current sources 112 and 122 (i.e., when the control signal 916 became LOW) until the time when the BIAS_EN signal 920 for the conversion of the digital input 218-3 becomes HIGH, to prepare for the conversion of the third digital input 218-3. In 610, the switches 512 and 522 are still open (as shown in FIG. 9 with the control signal BIAS_EN 920 being LOW in the time period 942) to continue decoupling the current sources 112 and 122 from their respective bias signals Vbias_pos and Vbias_neg, while the switches 514-3 and 524-3 become closed (as shown in FIG. 9 with the control signal neg 914 becoming HIGH in the time period 942), coupling, respectively, the current source 112 to the negative summing junction SJN of the amplifier A1 and the current source 122 to the positive summing junction SJP of the amplifier A1. In this state, the switches 514-2 and 524-2 as well as the switches 514-1 and 524-1 are open. Similar to the first state and to the first intermediate state, there is no current flow between the first current source 112 and the second current source 124 when the DAC cell 500 is in the second intermediate state. Because the current sources 112, 122 are now coupled to the summing junctions of the amplifier A1 (by virtue of their switches 514-3 and 524-3 now being closed) when the DAC cell 500 is in the second intermediate state, the voltages on their drain terminals (i.e., on the terminals which are coupled to the switches 114 and 124, respectively) may be driven substantially to the CM voltage of the amplifier A1. Because the time period 942 is within the hold period 944, i.e., when the switch 146 of the DAC 800 is closed (i.e., the HOLD signal 206, shown in FIG. 9, is HIGH) and the switches 142 and 144 of the DAC 800 are open (i.e., the HOLD_B signal, not shown in FIG. 9, but being the complementary to the HOLD signal, thus being LOW), the analog output 210 is unchanged since the feedback resistor R1 and R2 are still disconnected from the positive and negative summing junctions SJP and SJN. Thus, the analog output 210 is still indicative of the conversion of the zero digital input 218-2. Thus, in the second intermediate state that has a duration of the time period 942, the DAC cell 710 continues to generate an analog output corresponding to a conversion of a digital input 0.

In the embodiments where the second non-zero digital input that first follows the zero digital input converted in 606 of the method 600 is the digital input of +1, the pre-charge state 608 of the DAC cell 500 would be the same as shown in FIG. 7D, but the second intermediate state 610 would now be the same as the DAC cell 704, shown in FIG. 7B. In other words, the descriptions provided with respect to 610 would still be equally applicable except that, in this case, it would be the switches 514-1 and 524-1 that would become closed during the time period 942 (i.e., the control signal 912 would become HIGH) and the switches 514-3 and 524-3 would remain open (i.e., the control signal 914 would remain LOW), and the timing diagram of FIG. 9 would be modified so that the control signal 912 would become HIGH at the beginning of the time period 942.

After preparation 608 and 610 has been finished, the method 600 may continue with 612, where the DAC cell 500 is either in the first state or in a third state. The DAC cell 500 would be in the first state of the second non-zero digital input is the same as the first non-zero digital input (e.g., if both are +1 or both are −1). In this case, the DAC cell 500 would be as described with reference to 602. If the second non-zero digital input is different from the first non-zero digital input, then the DAC cell would be placed in a third state in 612, where the "third state" is a state of the DAC cell 500 where the current sources 112 and 122 are coupled to their load (e.g., to a summing component that combines outputs of different DAC cells of a DAC, e.g., to the amplifier A1) and to their respective bias signals Vbias_pos and Vbias_neg to produce an analog output corresponding to the second non-zero digital input that is different from the first non-zero digital input of 602. This scenario is illustrated in FIG. 7F, showing a DAC cell 712 which is the DAC cell 500 in the third state for the example where the first non-zero digital input was the digital input of +1 and the second non-zero digital input is the digital input of −1. The time period during which the DAC cell 500 is in the third state as shown in FIG. 7F is shown as a time period 944 in FIG. 9. FIG. 9 illustrates that the time period 944 is measured from the time when the BIAS_EN signal 920 for the conversion of the digital input 218-3 becomes HIGH until the time when the BIAS_EN signal 920 becomes LOW for the conversion of the next zero digital input (the latter not shown in FIG. 9). In this case, the switches 512 and 522 are closed to couple the current sources 112 and 122 to their respective bias signals Vbias_pos and Vbias_neg, while the switches 514-3 and 524-3 remain closed to couple, respectively, the current source 112 to the negative summing junction SJN of the amplifier A1 of the DAC 800 and the current source 122 to the positive summing junction SJP of the amplifier A1 of the DAC 800. In this state, the switches 514-2 and 524-2 are open, so that there is no current flow path between the first current source 112 and the second current source 124, and the switches 514-1 and 524-1 are open as well. In this state, the DAC cell 712 is configured to generate an analog output corresponding to a conversion of a digital input −1, which analog output may be provided to the summing junctions SJP and SJN of the amplifier A1 of the DAC 800, as was described above with reference to the DAC cell 100 of FIG. 1.

FIGS. 6-9 do not specifically illustrate configurations of the switches and the timing diagram when digital input values change from one non-zero digital value to another non-zero digital value because this may be performed in the same manner as is in conventional three-level DACs, e.g., such as the one described above. Furthermore, when digital input includes a plurality of consecutive zero values, the switches remain in the position as described above for the conversion of the zero value (i.e., the first and second transistors remain disconnected from their respective bias signals).

Figure 10:
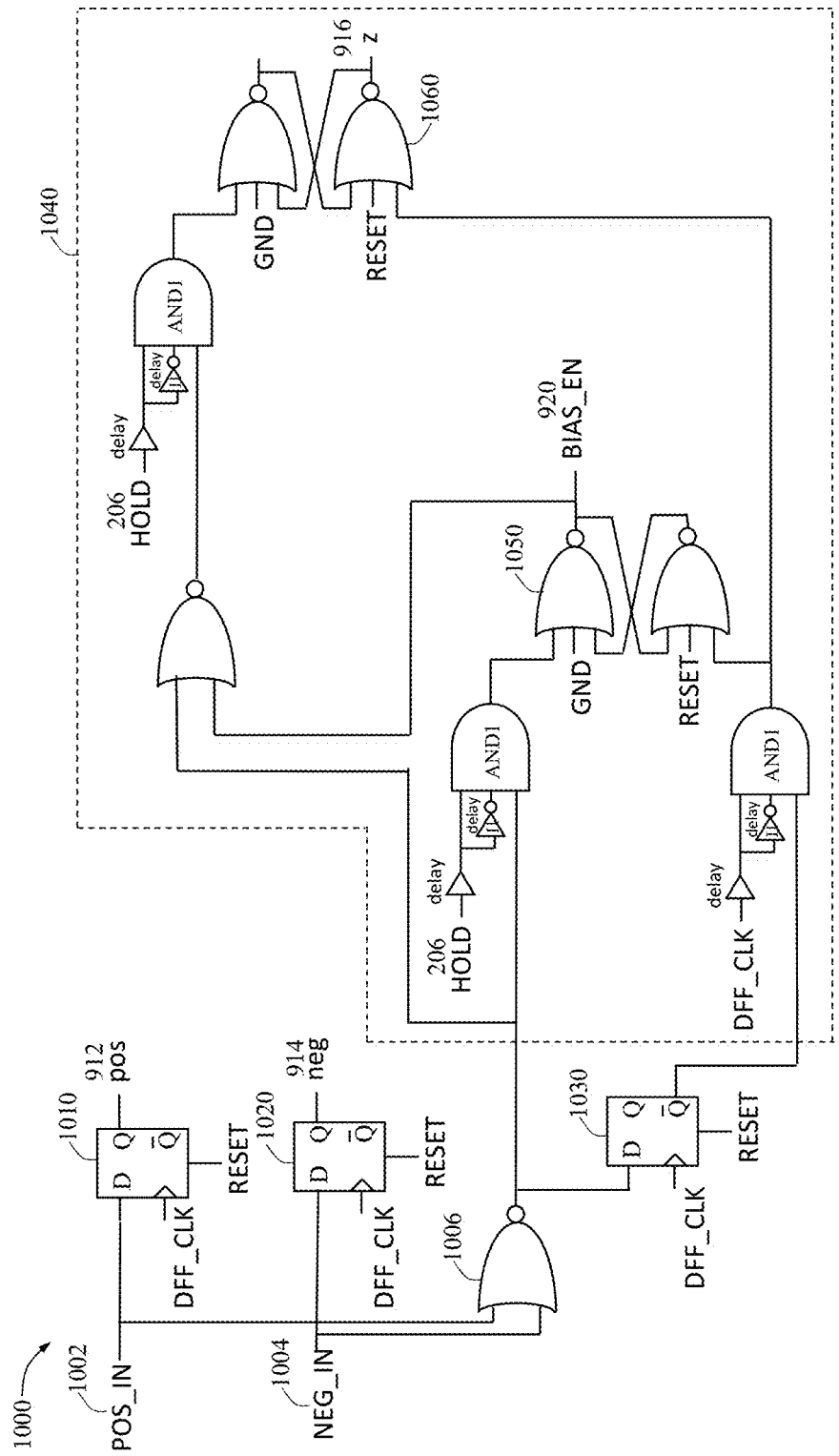
FIG. 10 illustrates an electric circuit diagram of a system for generating control signals operating a DAC cell configured to utilize current memory in the DAC of FIG. 8, according to some embodiments of the disclosure.

An example circuit that could be used to generate the control signals 912, 914, 916, and 920 for, respectively, switches 514-1/524-1 (pos), 514-3/524-3 (neg), 514-2/524-2 (z), and 512/522 (BIAS_EN) of the DAC cell 500 operating in the DAC 800 is shown as circuit 1000 in FIG. 10. As shown in FIG. 10, when a digital input/value being converted is positive, it is provided to an input POS_IN 1002. When a digital input/value being converted is negative, it is provided to an input NEG_IN 1004 of the circuit 1000.

When a digital value being converted is zero, which is the case when both input POS_IN 1002 and NEG_IN 1004 receive zeros, the output of a NOR gate 1006 will become a logic HIGH. The positive and negative digital values and the NOR gate output are then provided to their respective flip flops 1010, 1030 and 1020, respectively. The control signal 912 for the switches 514-1/524-1 is an output of the flip flop 1010. The control signal 914 for the switches 514-3/524-3 is an output of the flip flop 1030. The outputs of the NOR gate 1006 and the flip flop 1030 may be processed by a circuit 1040 that may include a plurality of components as illustrated in FIG. 10 to produce the control signal 920 for the switches 512/522 at an output of a NOR gate 1050 and to produce the control signal 916 for the switches 514-2/524-2 at an output of a NOR gate 1060. These control signals drive the switches to open and close as illustrated in FIG. 9. In the DAC 800, the control signals 912, 914, 916, and 920 are only making their transitions when the HOLD signal 206 is HIGH, at which time the I-to-V is in the "hold" stage where its voltage remains constant, ensuring that the switches 514-1/524-1 (pos), 514-3/524-3 (neg), 514-2/524-2 (z), and 512/522 (BIAS_EN) are switched only during the hold periods.

FIG. 10 provides only one example for the generation of the control signals 912, 914, 916, and 920 for the DAC cell 500. In other embodiments, other circuit architectures could be used for generating these signals in accordance with the switching techniques described herein.

Figure 11:
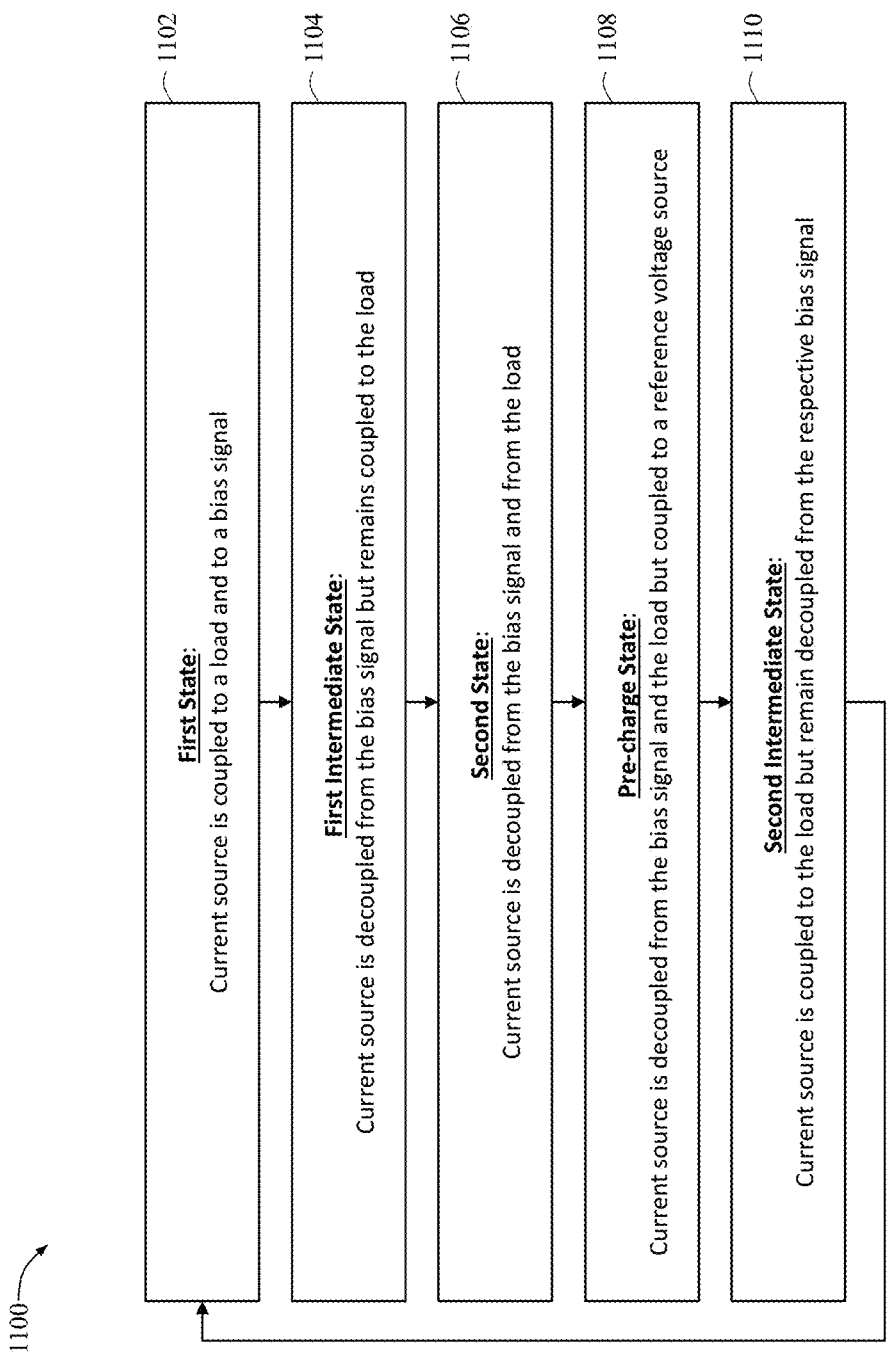
FIG. 11 illustrates a flow diagram of method steps for controlling a current source in a manner that utilizes current memory, according to some embodiments of the disclosure.

While description of the method 600 are provided above with respect to the DAC cells, in general, current memory effect as described herein may be used to reduce power consumption of current sources operating in any other systems where situations may occur that a current source may need to be disconnected from the bias signals for a certain time period. FIG. 11 illustrates a flow diagram of method steps for controlling a current source in a manner that utilizes current memory, according to some embodiments of the disclosure. The method 1100 may begin with 1102, where a current source is in a first state, where the "first state" is a state of the current source where it is coupled both to its' load and to its' bias signal. In this state the current source is operational. In order to put the current source into a power-saving mode, first, the current source is decoupled from the bias signal, in 1104, while remaining coupled to the load. Next, in 1106, the current source is also decoupled from the bias signal, thus entering the full power-saving mode. In order to take the current source out of the power-saving mode and place it into the operational mode again, first, in 1108, the current source is coupled to a reference voltage source to at least partially restore voltage on its' drain terminal. Next, in 1110, the current source is coupled to the load while remaining decoupled from the bias signal. Finally, the current source is coupled to the bias signal as well, in 1102.

Example DAC

Figure 12:
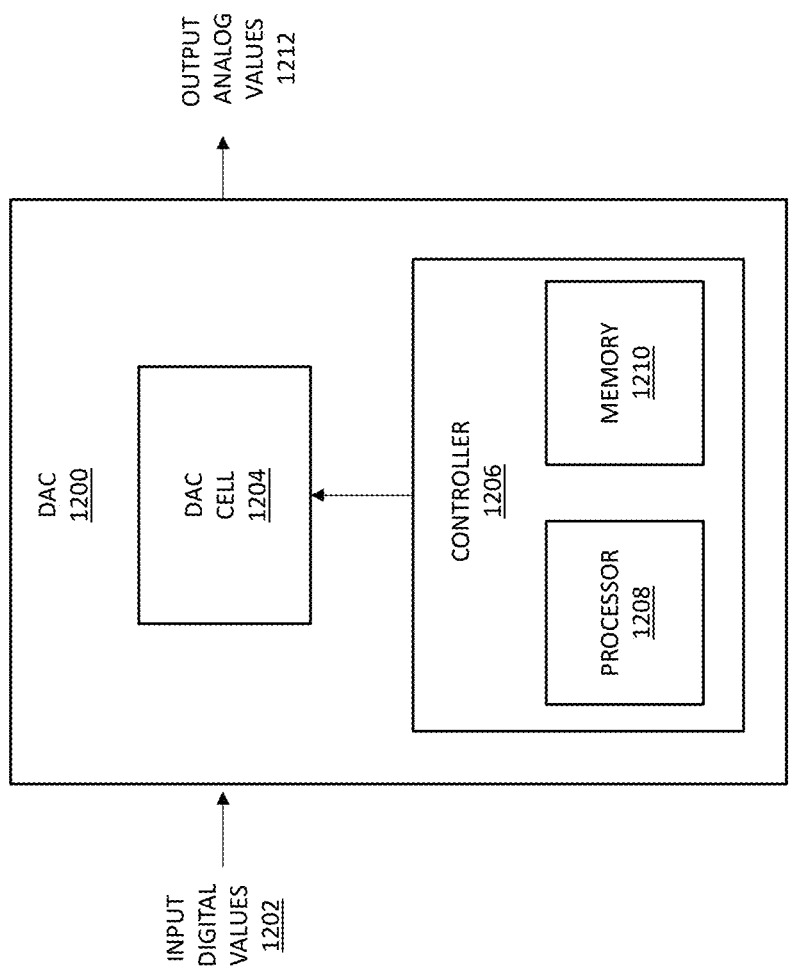
FIG. 12 illustrates a system view of an example apparatus configured to implement improved switching techniques of a three-level DAC cell configured to utilize current memory, according to some embodiments of the disclosure.

FIG. 12 illustrates a system view of an example apparatus 1200, e.g. a DAC, configured to implement improved switching techniques of a three-level DAC cell configured to utilize current memory, according to some embodiments of the disclosure. As shown in FIG. 12, the apparatus 1200 is configured to receive input digital values and provide at least some digital values to a DAC cell 1204. The DAC cell 1204 may be implemented as the DAC cell 500. Although only one DAC cell 1204 is shown in FIG. 12, typically the DAC 1200 would include a plurality of such DAC cells, as illustrated in some of the drawings described above, where at least one or more of the DAC cells 1204 are implemented as the DAC cell 500. The DAC 1200 may further include a controller 1206 configured to at least generate the control signals in the manner described above to allow or prevent current flowing through the DAC cell at different times, in accordance with the improved switching techniques described herein. To that end, in some embodiments, the controller 1206 may include at least a processor 1208 and a memory 1210, as shown in FIG. 12, configured to implement various improved switching techniques described herein. In other embodiments, however, the controller 1206 may be implemented to carry out the various improved switching techniques described herein by implementing a circuit such as the one shown in FIG. 10, or an analogous circuit configured to generate the control signals 912, 914, 916, and 920 for the switches 514-1/524-1 (pos), 514-3/524-3 (neg), 514-2/524-2 (z), and 512/522 (BIAS_EN), respectively, as described herein. Analog values 1212 (e.g., the output of the amplifier A1 of the DAC 800) may then be provided at the output of the DAC 1200.

In various embodiments, each DAC cell 1204 may be associated with a respective individual controller 1206. In other embodiments, the controller 1206 may be configured to control two or more, possibly all, DAC cells 1204 of the DAC 1200. Furthermore, while FIG. 12 illustrates the controller 1206 to be included within the DAC 1200, in other embodiments, the controller 1206 may be implemented external to the DAC 1200, in which case the controller 1206 may be configured to control the DAC 1200 remotely, via any appropriate communication channel. In other words, instead of being implemented within the DAC 1200 as shown in FIG. 12, the controller 1206 may be external to the DAC 1200 and be communicatively coupled to the DAC 1200.

Example Data Processing System

Figure 13:
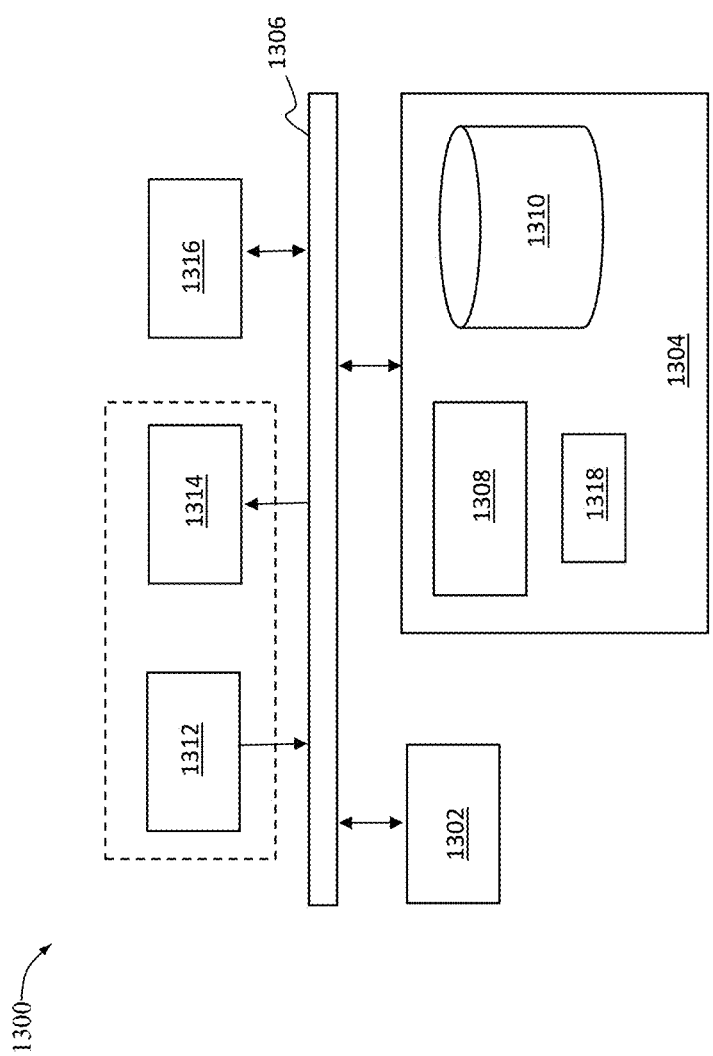
FIG. 13 depicts a block diagram illustrating an example data processing system, according to some embodiments of the disclosure.

FIG. 13 depicts a block diagram illustrating an example data processing system 1300, according to one embodiment of the present disclosure. Such a data processing system could be configured to, e.g., function as the controller 1206 described herein or as any other system configured to implement various improved switching techniques described herein.

As shown in FIG. 13, the data processing system 1300 may include at least one processor 1302 coupled to memory elements 1304 through a system bus 1306. As such, the data processing system may store program code within memory elements 1304. Further, the processor 1302 may execute the program code accessed from the memory elements 1304 via a system bus 1306. The program code may include instructions to execute improved switching techniques that utilize current memory, as described herein. In one aspect, the data processing system may be implemented as a computer that is suitable for storing and/or executing program code. It should be appreciated, however, that the data processing system 1300 may be implemented in the form of any system including a processor and a memory that is capable of performing the functions described within this specification.

The memory elements 1304 may include one or more physical memory devices such as, for example, local memory 1308 and one or more bulk storage devices 1310. The local memory may refer to random access memory or other non-persistent memory device(s) generally used during actual execution of the program code. A bulk storage device may be implemented as a hard drive or other persistent data storage device. The processing system 1300 may also include one or more cache memories (not shown) that provide temporary storage of at least some program code in order to reduce the number of times program code must be retrieved from the bulk storage device 1310 during execution.

Input/output (I/O) devices depicted as an input device 1312 and an output device 1314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 13 with a dashed line surrounding the input device 1312 and the output device 1314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1300, and a data transmitter for transmitting data from the data processing system 1300 to said systems, devices and/or networks. Modems, cable modems, and Ethernet cards are examples of different types of network adapter that may be used with the data processing system 1300.

As pictured in FIG. 13, the memory elements 1304 may store an application 1318. In various embodiments, the application 1318 may be stored in the local memory 1308, the one or more bulk storage devices 1310, or apart from the local memory and the bulk storage devices. It should be appreciated that the data processing system 1300 may further execute an operating system (not shown in FIG. 13) that can facilitate execution of the application 1318. The application 1318, being implemented in the form of executable program code, can be executed by the data processing system 1300, e.g., by the processor 1302. Responsive to executing the application, the data processing system 1300 may be configured to perform one or more operations or method steps described herein, e.g., any of the operations of the switching techniques that utilize current memory, described herein.

Variations and Implementations

While embodiments of the present disclosure were described above with references to example implementations as shown in FIGS. 1-13, a person skilled in the art will realize that the various teachings described above are applicable to a large variety of other implementations.

For example, while some descriptions provided in the present disclosure refer to thermometer coding, these descriptions are equally applicable to other coding methods used in DACs.

In another example, while some example embodiments are described herein with reference to a DAC comprising 16 DAC cells (e.g., as shown in FIG. 8), of course in other implementations any other number of DAC cells could be used.

In yet another example, descriptions provided herein refer to a PMOS transistor implementing the current source 112 being coupled to the supply 152 and to an NMOS transistor implementing the current source 122 being coupled to the ground 154. This is because for conventional silicon-based MOS transistors, the bias voltage for a PMOS transistor is just a few hundred millivolts (mV) away from the ground, while the bias voltage for an NMOS transistor is just a few hundred mV away from the supply voltage, so it is more effective to use an NMOS transistor coupled to the supply 152 and to use a PMOS transistor coupled to the ground 154. However, in other embodiments, the current source 112 may be implemented as an NMOS transistor and the current source 122 may be implemented as a PMOS transistor.

Still in another example, descriptions provided herein refer to individual switches being either closed or open. However, in general, these descriptions are equally applicable to switches (which may be implemented as any suitable component or a combination of components) being either in a first state or in a second state. The first state may be a state where the switch enables current conduction, or provides electrical connectivity, between points A and B (which may be the different terminals of the switch). Such a state is commonly referred to as a switch being "closed." The second state may be a state where the switch does not allow current conduction, or does not provide electrical connectivity, between points A and B. Such a state is commonly referred to as a switch being "open."

Similarly, descriptions provided herein refer to various control signals being in a logic state "HIGH" to close a switch (or, more generally, to provide electrical connectivity through the switch) and being in a logic state "LOW" to open a switch (or, more generally, to disrupt electrical connectivity through the switch). However, these descriptions are equally applicable to embodiments where various control signals could be in a logic state "LOW" to close a switch (or, more generally, to provide electrical connectivity through the switch) and be in a logic state "HIGH" to open a switch (or, more generally, to disrupt electrical connectivity through the switch). More generally, these descriptions are equally applicable to embodiments where various control signals could be in a first state (e.g., have a first value or amplitude) to place a switch in a corresponding first state of a switch (e.g., to provide electrical connectivity through the switch) and where various control signals could be in a second state (e.g., have a second value or amplitude) to place a switch in a corresponding second state of a switch (e.g., to disrupt electrical connectivity through the switch).

Embodiments of the present disclosure may be particularly advantageous for oversampling, or interpolating, DACs, such as e.g. sigma-delta DACs, because of their high speed. However, the techniques presented herein are not limited to oversampling DACs as they are equally applicable, possibly with modifications that would be apparent to a person of ordinary skill in the art, to other types of DACs, such as e.g. Nyquist DACs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the switching techniques that utilize current memory discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, e.g., components of the DAC 800 and/or components of the DAC cell 500, such as clocks, switches, amplifiers, logic gates, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to switching techniques that utilize current memory.

Parts of various systems for implementing switching techniques that utilize current memory as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure implementing switching techniques that utilize current memory described herein may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of switching techniques that utilize current memory proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The descriptions apply only to some non-limiting examples and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

It is also important to note that the functions related to switching techniques that utilize current memory as proposed herein illustrate only some of the possible functions that may be executed by, or within, systems illustrated in the drawings. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

SELECT EXAMPLES

The following paragraphs provide examples of various ones of the embodiments disclosed herein.

Example 1 provides a controller for controlling operation of a 3-level current steering DAC cell that includes a first transistor, a second transistor, and a plurality of switches, where an individual switch of the plurality of switches is coupled to at least one of a drain terminal of the first transistor and a drain terminal of the second transistor to convert digital values (e.g., 3-level digital values of 0, 1, and −1) to analog output/signals. The controller is configured to configure the plurality of switches to be in a first state to enable the DAC cell to convert a first non-zero digital value (i.e., to enable the DAC cell to generate an analog signal corresponding to the first non-zero digital value), while keeping a bias signal connected to each of the first and second transistors. When a digital value to be converted by the DAC cell changes from being the first non-zero digital value to a zero digital value, the controller is further configured to disconnect a first bias signal from a gate terminal of the first transistor and disconnect a second bias signal from a gate terminal of the second transistor, keep the plurality of switches to be in the first state for a non-zero time period after the first and second bias signals have been disconnected; and after the non-zero time period of keeping the plurality of switches in the first state with the first and second bias signals disconnected (i.e., after this time period has expired), configure the plurality of switches to be in a second state to enable the DAC cell to convert the zero digital value (i.e., to enable the DAC cell to generate an analog signal corresponding to the zero digital value).

Example 2 provides the controller according to example 1, further configured to, when a digital value to be converted by the DAC cell changes from being the zero digital value to a second non-zero digital value, configure the plurality of switches from being in the second state to be in an intermediate state, the intermediate state being a state that provides a current path between the first transistor and the second transistor. Such a current path may be a current path between the drain terminals of the first and second transistors, enabling the current to flow between the drain terminals of the first and second transistors even though the first and second bias signals are still disconnected from the first and second transistors. After a non-zero time period of keeping the plurality of switches in the intermediate state (i.e., after this time period has expired), the controller may configure the plurality of switches to be in 1) the first state, if the second non-zero digital value has a value that is same as a value of the first non-zero digital value (e.g., if both the first and second non-zero digital values have a value of "1" or if both have a value of "−1"), or 2) a third state, if the second non-zero digital value has the value that is different from the value of the first non-zero digital value (e.g., if the first non-zero digital value had a value of "1" and the second non-zero digital value has a value of "−1| or vice versa). After a non-zero time period after the plurality of switches has been configured to be in the first state or the third state (i.e., after this time period has expired), the controller is configured to connect the first bias signal to the gate terminal of the first transistor and connect the second bias signal to the gate terminal of the second transistor to enable the DAC cell to convert the second non-zero digital value (i.e., to enable the DAC cell to generate an analog signal corresponding to the second non-zero digital value).

Example 3 provides the controller according to example 2, where the first state (i.e., a state where the DAC cell is enabled to convert first non-zero digital value values, e.g., values of 1) is a state where the current path between the first transistor and the second transistor is disrupted or does not exist.

Example 4 provides the controller according to examples 2 or 3, where the third state (i.e., a state where the DAC cell is enabled to convert second non-zero digital value values, e.g., values of −1) is a state where the current path between the first transistor and the second transistor is disrupted or does not exist.

Example 5 provides the controller according to any one of examples 2-4, where the second state (i.e., a state where the DAC cell is enabled to convert zero digital value values, i.e., values of 0) is a state where the current path between the first transistor and the second transistor is disrupted or does not exist. Thus, the current path between the first and second transistors only exist when the plurality of switches are in the intermediate state.

Example 6 provides the controller according to any one of examples 2-4, where the DAC cell is configured to maintain an analog output associated with a conversion of each digital value for a hold period associated with the each digital value changing to a next digital value, and the non-zero time period of keeping the plurality of switches in the intermediate state is within a hold period associated with the zero digital value changing to the second non-zero digital value.

Example 7 provides the controller according to example 6, where the controller is configured to connect the first bias signal to the gate terminal of the first transistor and connect the second bias signal to the gate terminal of the second transistor during the hold period associated with the zero digital value changing to the second non-zero digital value.

Example 8 provides the controller according to any one of the preceding examples, where the DAC cell is configured to maintain an analog output associated with a conversion of each digital value for a hold period associated with the each digital value changing to a next digital value, and the non-zero time period of keeping the plurality of switches in the first state with the first and second bias signals disconnected is within a hold period associated with the first non-zero digital value changing to the zero digital value.

Example 9 provides the controller according to example 8, where the controller is configured to disconnect the first bias signal from the gate terminal of the first transistor and disconnect the second bias signal from the gate terminal of the second transistor during the hold period associated with the first non-zero digital value changing to the zero digital value.

Example 10 provides the controller according to any one of the preceding examples, where each of the first and second transistors includes a first terminal, a second terminal, and a third terminal, the first bias signal is connected to the first transistor by being applied to the first terminal of the first transistor, the second bias signal is connected to the second transistor by being applied to the first terminal of the second transistor, the second terminal of the first transistor is coupled to a supply voltage, the second terminal of the second transistor is coupled to a ground potential, and the individual switch of the plurality of switches is coupled to at least one of the first transistor and the second transistor by being coupled to at least one of the third terminal of the first transistor and the third terminal of the second transistor.

Example 11 provides a DAC system that includes a DAC cell and a controller. The DAC cell includes a first transistor, a second transistor, and a plurality of switches, where an individual switch of the plurality of switches is coupled to at least one of the first transistor and the second transistor. The controller is configured to: when a digital value to be converted by the DAC cell changes from being a non-zero digital value to a zero digital value, disconnect respective bias signals from the first and second transistors while keeping, for a duration of a first time period, the plurality of switches in a state where the DAC cell generates (e.g., continues to generate) an analog output associated with a conversion of the non-zero digital value, and after the first time period ends, re-configure the plurality of switches to be in a state where no current path exists between the first and second transistors and the DAC cell generates an analog output associated with a conversion of the zero digital value.

Example 12 provides the DAC system according to example 11, where, when a digital value to be converted by the DAC cell changes from being the zero digital value to the non-zero digital value, the controller is configured to re-configure the plurality of switches to be, for a duration of a second time period, in a state where a current path exists between the first and second transistors, after the second time period ends, re-configure the plurality of switches to be in the state where the DAC cell generates the analog output associated with the conversion of the non-zero digital value, and after a non-zero time period after the plurality of switches has been re-configured to be in the state where the DAC cell generates the analog output associated with the conversion of the non-zero digital value, connect the respective bias signals to the first and second transistors.

Example 13 provides the DAC system according to examples 11 or 12, where each of the first and second transistors is a field-effect transistor.

Example 14 provides a controller for controlling a state of a current source, the controller configured to, after the current source has been set to be in a first state where a bias signal is applied to the current source and the current source is coupled to a load, set the current source to be in a second state by: decoupling the bias signal from the current source, keeping the current source coupled to the load for a first non-zero time period after the bias signal has been decoupled from the current source, and decoupling the current source from the load to set the current source to be in the second state where the bias signal is decoupled from the current source and the current source is decoupled from the load.

Example 15 provides the controller according to example 14, where, after the current source has been set to be in the second state, the controller is configured to re-set the current source to be in the first state by: coupling the current source to the load, keeping the bias signal decoupled from the current source for a second non-zero time period after the current source has been coupled to the load, and coupling the bias signal to the current source to set the current source to be in the first state.

Example 16 provides the controller according to examples 14 or 15, where, when the current source is in the first state, a current flow between the current source and the load is enabled, and, when the current source is in the second state, the current flow between the current source and the load is disabled.

Example 17 provides the controller according to example 16, where an intermediate state of the current source is a state where the current source is coupled to the load and decoupled from the bias signal, and, when the current source is in the intermediate state, the current flow between the current source and the load is enabled.

Example 18 provides the controller according to any one of examples 14-17, where the current source includes a first terminal, a second terminal, and a third terminal; the bias signal is coupled to the current source by being electrically coupled to the first terminal; the load is coupled to the current source by being electrically coupled to the second terminal; and the third terminal is coupled to a supply voltage or a ground potential.

In some embodiments of a controller according to example 18, the current source may be implemented as a FET, where the first terminal is the gate terminal, the second terminal is the drain terminal, and the third terminal is the source terminal of the FET.

Example 19 provides the controller according to any one of examples 14-18, where the load is a summing amplifier of a DAC.

Example 20 provides the controller according to any one of examples 14-19, where the state of the current source controls operation of a 3-level current steering DAC cell.

Example 21 provides a DAC system that includes a DAC cell and a controller. The DAC cell may include a first transistor, a second transistor, and a plurality of switches, where an individual switch of the plurality of switches is coupled to at least one of the first transistor and the second transistor. The controller may be a controller according to any one of the preceding examples.

Example 22 provides a non-transitory computer readable storage medium storing software code portions configured for, when executed on a processor, carrying out functionality of a controller according to any one of the preceding examples.

The invention claimed is:

1. A controller for controlling operation of a digital-to-analog converter (DAC) cell that includes a first transistor, a second transistor, and a plurality of switches, where an individual switch of the plurality of switches is coupled to at least one of the first transistor and the second transistor, the controller configured to:
configure the plurality of switches to be in a first state to enable the DAC cell to convert a first non-zero digital value; and
when a digital value to be converted by the DAC cell changes from being the first non-zero digital value to a zero digital value:
disconnect a first bias signal from the first transistor and disconnect a second bias signal from the second transistor,
keep the plurality of switches to be in the first state for a non-zero time period after the first and second bias signals have been disconnected; and
after the non-zero time period of keeping the plurality of switches in the first state with the first and second bias signals disconnected, configure the plurality of switches to be in a second state to enable the DAC cell to convert the zero digital value.

2. The controller according to claim 1, further configured to, when a digital value to be converted by the DAC cell changes from being the zero digital value to a second non-zero digital value:
configure the plurality of switches to be in an intermediate state, the intermediate state being a state that provides a current path between the first transistor and the second transistor;
after a non-zero time period of keeping the plurality of switches in the intermediate state, configure the plurality of switches to be in:
the first state, if the second non-zero digital value has a value that is same as a value of the first non-zero digital value, or
a third state, if the second non-zero digital value has the value that is different from the value of the first non-zero digital value; and after the plurality of switches has been configured to be in the first state or the third state, connect the first bias signal to the first transistor and connect the second bias signal to the second transistor to enable the DAC cell to convert the second non-zero digital value.

3. The controller according to claim 2, wherein the first state is a state where the current path between the first transistor and the second transistor is disrupted or does not exist.

4. The controller according to claim 2, wherein the third state is a state where the current path between the first transistor and the second transistor is disrupted or does not exist.

5. The controller according to claim 2, wherein the second state is a state where the current path between the first transistor and the second transistor is disrupted or does not exist.

6. The controller according to claim 2, wherein:
the DAC cell is configured to maintain an analog output associated with a conversion of each digital value for a hold period associated with the each digital value changing to a next digital value, and
the non-zero time period of keeping the plurality of switches in the intermediate state is within a hold period associated with the zero digital value changing to the second non-zero digital value.

7. The controller according to claim 6, wherein the controller is configured to connect the first bias signal to the first transistor and connect the second bias signal to the second transistor during the hold period associated with the zero digital value changing to the second non-zero digital value.

8. The controller according to claim 1, wherein:
the DAC cell is configured to maintain an analog output associated with a conversion of each digital value for a hold period associated with the each digital value changing to a next digital value, and
the non-zero time period of keeping the plurality of switches in the first state with the first and second bias signals disconnected is within a hold period associated with the first non-zero digital value changing to the zero digital value.

9. The controller according to claim 8, wherein the controller is configured to disconnect the first bias signal from the first transistor and disconnect the second bias signal from the second transistor during the hold period associated with the first non-zero digital value changing to the zero digital value.

10. The controller according to claim 1, wherein:
each of the first and second transistors includes a first terminal, a second terminal, and a third terminal,
the first bias signal is connected to the first transistor by being applied to the first terminal of the first transistor,
the second bias signal is connected to the second transistor by being applied to the first terminal of the second transistor,
the second terminal of the first transistor is coupled to a supply voltage,
the second terminal of the second transistor is coupled to a ground potential, and
the individual switch of the plurality of switches is coupled to at least one of the first transistor and the second transistor by being coupled to at least one of the third terminal of the first transistor and the third terminal of the second transistor.

11. A digital-to-analog converter (DAC) system, comprising:
a DAC cell that includes a first transistor, a second transistor, and a plurality of switches, where an individual switch of the plurality of switches is coupled to at least one of the first transistor and the second transistor; and
a controller, configured to:
when a digital value to be converted by the DAC cell changes from being a non-zero digital value to a zero digital value,
disconnect respective bias signals from the first and second transistors while keeping, for a duration of a first time period, the plurality of switches in a state where the DAC cell generates an analog output associated with a conversion of the non-zero digital value, and
after the first time period ends, re-configure the plurality of switches to be in a state where no current path exists between the first and second transistors and the DAC cell generates an analog output associated with a conversion of the zero digital value.

12. The DAC system according to claim 11, wherein, when a digital value to be converted by the DAC cell changes from being the zero digital value to the non-zero digital value, the controller is configured to:
re-configure the plurality of switches to be, for a duration of a second time period, in a state where a current path exists between the first and second transistors,
after the second time period ends, re-configure the plurality of switches to be in the state where the DAC cell generates the analog output associated with the conversion of the non-zero digital value, and
after a non-zero time period after the plurality of switches has been re-configured to be in the state where the DAC cell generates the analog output associated with the conversion of the non-zero digital value, connect the respective bias signals to the first and second transistors.

13. The DAC system according to claim 11, wherein each of the first and second transistors is a field-effect transistor.

14. A controller for controlling a state of a current source, the controller configured to:
after the current source has been set to be in a first state where a bias signal is applied to the current source and the current source is coupled to a load, set the current source to be in a second state by:
decoupling the bias signal from the current source,
keeping the current source coupled to the load for a first non-zero time period after the bias signal has been decoupled from the current source, and
decoupling the current source from the load to set the current source to be in the second state where the bias signal is decoupled from the current source and the current source is decoupled from the load.

15. The controller according to claim 14, wherein, after the current source has been set to be in the second state, the controller is configured to re-set the current source to be in the first state by:
coupling the current source to the load,
keeping the bias signal decoupled from the current source for a second non-zero time period after the current source has been coupled to the load, and
coupling the bias signal to the current source to set the current source to be in the first state.

16. The controller according to claim 14, wherein:
when the current source is in the first state, a current flow between the current source and the load is enabled, and when the current source is in the second state, the current flow between the current source and the load is disabled.

17. The controller according to claim 16, wherein:
an intermediate state of the current source is a state where the current source is coupled to the load and decoupled from the bias signal, and
when the current source is in the intermediate state, the current flow between the current source and the load is enabled.

18. The controller according to claim 14, wherein:
the current source includes a first terminal, a second terminal, and a third terminal,
the bias signal is coupled to the current source by being coupled to the first terminal,
the load is coupled to the current source by being coupled to the second terminal, and
the third terminal is coupled to a supply voltage or a ground potential.

19. The controller according to claim 14, wherein the load is a summing amplifier of a digital-to-analog converter (DAC).

20. The controller according to claim 14, wherein the state of the current source controls operation of a 3-level current steering digital-to-analog converter (DAC) cell.

* * * * *